United States Patent
Park et al.

(10) Patent No.: US 7,675,783 B2
(45) Date of Patent: Mar. 9, 2010

(54) NONVOLATILE MEMORY DEVICE AND DRIVING METHOD THEREOF

(75) Inventors: Ki-Tae Park, Seongnam-si (KR); Ki-Nam Kim, Gangnam-gu (KR); Yeong-Taek Lee, Songpa-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 121 days.

(21) Appl. No.: 12/035,732

(22) Filed: Feb. 22, 2008

(65) Prior Publication Data

US 2008/0205163 A1    Aug. 28, 2008

(30) Foreign Application Priority Data

Feb. 27, 2007    (KR) .................. 10-2007-0019772
Sep. 6, 2007     (KR) .................. 10-2007-0090617

(51) Int. Cl.
*G11C 16/04* (2006.01)

(52) U.S. Cl. ..................... 365/185.24; 365/185.11; 365/185.18; 365/185.28; 365/185.29

(58) Field of Classification Search ............ 365/185.11, 365/185.18, 185.24, 185.28, 185.29
See application file for complete search history.

(56) References Cited

U.S. PATENT DOCUMENTS 7,443,734 B2 * 10/2008 Shibata ............... 365/185.23

FOREIGN PATENT DOCUMENTS

| JP | 2003109391 | 4/2003 |
|----|------------|--------|
| KR | 1020000050309 A | 8/2000 |
| KR | 1020060058030 A | 5/2006 |

* cited by examiner

*Primary Examiner*—Hoai V Ho
(74) *Attorney, Agent, or Firm*—Volentine & Whitt, PLLC

(57) ABSTRACT

Provided are a nonvolatile memory device and a driving method thereof. In the method of driving a nonvolatile memory device, a structural shape and position of a memory cell to be driven is determined, and then the memory cell is driven with an optimized operating condition according to a distribution of the memory cell using a determination result.

19 Claims, 18 Drawing Sheets

NONVOLATILE MEMORY DEVICE AND DRIVING METHOD THEREOF

CROSS-REFERENCE TO RELATED APPLICATIONS

This U.S. non-provisional patent application claims priority under 35 U.S.C. § 119 of Korean Patent Application Nos. 10-2007-0019772, filed on Feb. 27, 2007, and 10-2007-0090617, filed on Sep. 6, 2007, the entire contents of which are hereby incorporated by reference.

BACKGROUND OF THE INVENTION

1. Field of the Invention

The invention disclosed herein relates generally to a nonvolatile memory device, and more particularly, but without limitation, to a method of driving a nonvolatile memory device.

2. Description of the Related Art

Nonvolatile memory devices retain data stored in cells even if power is not supplied. Flash memory devices are one type of nonvolatile memory. Since flash memory devices electrically erase a block of data cells at a time, flash memory devices are being widely used in computers, memory cards, etc.

Such a flash memory device is classified into a NOR flash memory and a NAND flash memory. One distinction between NOR flash memory and NAND flash memory relates to how memory cells are connected to a bitline. In general, the NOR flash memory device is advantageous in high-speed performance, whereas it is disadvantageous in high integration due to its high current consumption. The NAND flash memory device is advantageous in high integration because it consumes smaller amount of current than the NOR flash memory device.

FIG. 1 is a circuit diagram of a memory cell array 110 using a double patterning technique (DPT). Generally, the DPT is a patterning technique to overcome a limitation of a photolithographic apparatus. According to the DPT, the memory cell array is formed in such a way that even-numbered patterns are formed first and odd-numbered patterns are thereafter formed.

FIGS. 2A through 2C are pictorial illustrations of shapes and configurations of wordlines and bitlines in FIG. 1. Specifically, FIG. 2A is a sectional view illustrating a channel of a memory cell, which is taken along line A-A' of FIG. 1. Referring to FIG. 2A, a channel width of a wordline differs according to whether the wordline is an even-numbered one or an odd-numbered one. Herein, the even-numbered wordline has a channel width Lg1 that is smaller than a channel width Lg2 of the odd-numbered wordline. FIG. 2B is a sectional view illustrating a width of an active region of a memory cell, which is taken along line B-B' of FIG. 1. Referring to FIG. 2B, an active region of an even memory cell has a width AW1 that is smaller than a width AW2 of an active region of an odd memory cell. FIG. 2C illustrates metal widths of odd and even-numbered bitlines. Referring to FIG. 2C, the even-numbered bitline has a width BW1 that is smaller than a width BW2 of the odd-numbered bitline.

FIG. 3 is a graphical illustration of threshold voltage distributions of memory cells manufactured according to the DPT. Referring to FIG. 3, there is a difference in threshold voltage distribution according to whether the memory cell is an even-numbered cell or an odd-numbered cell. Herein, the even-numbered memory cell means a memory cell connected to the even-numbered wordline, and the odd-numbered memory cell means a memory cell connected to the odd-numbered wordline. In a typical nonvolatile memory device performing a program operation according to an incremental step pulse programming (ISPP) method, however, program operating conditions, for example, a program start voltage ($V_o$), an ISPP incremental level ($\Delta ISPP$) and a program stop voltage ($V_m$), are determined from a total distribution irrespective of whether the memory cell is an odd-numbered cell or and even-numbered cell. Here, the program operating conditions satisfy following Equations 1 and 2.

$$Vm = V_o + m\Delta ISPP \quad \text{(Equation 1)}$$

$$\Delta Vw = Vm - V_0 \quad \text{(Equation 2)}$$

where m is an iteration number of a program loop for reaching a program stop voltage (Vm).

As illustrated in FIG. 3, the total distribution is relatively broader than the distribution of even-numbered memory cells and odd-numbered memory cells. Consequently, it is difficult for the typical nonvolatile memory device to have an optimized programming time because the program operating conditions are determined from the total threshold voltage distribution. This is because the programming time is proportional to the width of the threshold voltage distribution in general. Further, the width ($\Delta Vw$) of the distribution becomes great in ISPP operation, and hence the iteration number (m) of the program loop increases correspondingly. This leads to an increase in stress of a memory cell, resulting in deterioration of reliability of the memory cell in the long run.

FIG. 4 is an equivalent circuit diagram and an associated voltage-time curves for a conventional bitline structure and sensing method. The width of the bitline differs according to whether the bitline is an odd-numbered bitline or even-numbered bitline, as illustrated in FIG. 2C. Referring to FIG. 4, therefore, parasitic resistance and capacitance also differ according to whether the bitline is an odd-numbered bitline or an even-numbered bitline. That is, a parasitic resistance Re of the even-numbered bitline is greater than a parasitic resistance Ro of the odd-numbered bitline, and a parasitic capacitance Ce of the even-numbered bitline is smaller than a parasitic capacitance Co of the odd-numbered bitline. This is attributed to the fact that the width BW1 of the even-numbered bitline is smaller than the width BW2 of the odd-numbered bitline. This may cause a RC time constant to differ according to whether the bitline is an odd-numbered bitline or even-numbered bitline. For convenience in description, it is assumed that an RC time constant (ReCe) of the even-numbered bitline is greater than an RC time constant (RoCo) of the odd-numbered bitline.

As a result, sensing operating conditions (e.g., precharge time, development time) will differ according to whether the bitline is the even-numbered bitline or the odd-numbered bitline. Herein, the precharge time refers to a time taken for a bitline voltage to rise up to a precharge voltage, e.g., a power supply voltage. The development time refers to a time taken for the bitline voltage to drop to a trip voltage Vtrip from the precharge voltage. If the bitline is an even-numbered bitline, the precharge time is shorter than that of the odd-numbered bitline, and the development time is longer than that of the odd-numbered bitline. On the contrary, if the bitline is an odd-numbered bitline, the precharge time is longer than that of the even-numbered bitline, and the development time is shorter than that of the even-numbered bitline. However, the typical nonvolatile memory device operates with the same sensing operating condition regardless of whether the bitline is an even-numbered bitline or an odd-numbered bitline.

That is, under the sensing operating condition of the typical nonvolatile memory device, a sensing time Ts is determined such that it includes both the precharge time Tpc of the odd-numbered bitline which is relatively longer than that of the even-numbered bitline and a development time Td of the even-numbered bitline which is relatively longer than that of the odd-numbered bitline. As illustrated in FIG. 4, waiting times Tw1 and Tw2 take place in the even-numbered and odd-numbered bitlines, respectively. That is, the typical nonvolatile memory device cannot optimize a sensing time.

Referring to FIG. 4 again, in a precharge operation of the even-numbered bitline BLe, the even-numbered bitline BLe is precharged faster than the odd-numbered bitline BLo. However, the precharge time Tpc is limited by the precharge time of the odd-bitline BLo. In a development operation of the odd-numbered bitline BLo, the odd-numbered bitline BLo is developed faster than the even-numbered bitline BLe. In this case, however, a cell current development time Td is limited by the development time of the even-numbered bitline BLe. This leads to degradation in read/verify characteristics of a nonvolatile memory device. Improved nonvolatile memory device structures are therefore needed.

SUMMARY OF THE INVENTION

Embodiments of the invention provide a nonvolatile memory device and method that optimize performance based on differences in threshold voltage distribution.

An embodiment of the invention provides a method of driving a nonvolatile memory device including: determining a structural position of a memory cell to be driven; and driving the memory cell with an operating condition according to a threshold voltage distribution of the memory cell using a determination result.

Another embodiment of the invention provides a nonvolatile memory device. The nonvolatile memory device includes: a memory cell array including a plurality of memory cells, each of the plurality of memory cells being located at an intersection of a plurality of wordlines and a plurality of bitlines; a row decoder coupled to the memory cell array and configured to select one of the plurality of wordlines; and a wordline voltage generator coupled to the row decoder and configured to output a wordline voltage, the wordline voltage having an operating condition according to a threshold voltage distribution associated with a selected one of the plurality of memory cells.

BRIEF DESCRIPTION OF THE FIGURES

The accompanying figures are included to provide a further understanding of the invention, and are incorporated in and constitute a part of this specification. The drawings illustrate exemplary embodiments of the invention and, together with the description, serve to explain principles of the invention. In the figures:

FIGS. 2A through 2C are pictorial illustrations of shapes and configurations of wordlines and bitlines in FIG. 1, in which FIG. 2A illustrates a sectional view of a channel of a memory cell taken along line A-A' of FIG. 1, FIG. 2B illustrates a sectional view of a width of an active region of the memory cell taken along line B-B' of FIG. 1, and FIG. 2C illustrates metal widths of odd- and even-numbered bitlines;

FIGS. 6A through 6C are graphical illustrations of a voltage of the nonvolatile memory device of FIG. 5, in which FIG. 6A illustrates threshold voltage distribution characteristics according to whether a memory cell is an even-numbered or odd-numbered memory cell, FIG. 6B illustrates a programming operation on even-numbered memory cells, and FIG. 6C illustrates a programming operation on odd-numbered memory cells;

FIGS. 13A through 13C are graphical illustrations of a programming method of the nonvolatile memory device in FIG. 12, in which FIG. 13A illustrates threshold voltage distributions according to whether a memory cell belongs to a first layer or a second layer, FIG. 13B illustrates a programming operation on memory cells of the first layer, and FIG. 13C illustrates a programming operation on memory cells of the second layer;

DETAILED DESCRIPTION OF PREFERRED EMBODIMENTS

Preferred embodiments of the invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

A nonvolatile memory device according to an embodiment of the invention determines a structural shape and position of a memory cell to be driven, and thus operates with operating conditions suitable for distribution characteristics of the memory cells to be driven according to the determination results. Wherein the structural shape and position includes width of a wordline, width and height of an active region, and distance between two adjacent wordlines. Accordingly, it is possible to improve characteristics of threshold voltage distribution and performance degradation caused by the structural shape and position of the memory cell. Wherein the operating condition includes a wordline voltage, a bitline voltage, a well voltage, and timings thereof.

A nonvolatile memory device according to a first embodiment may be driven in separate ways suitable for distribution characteristics of memory cells according to whether a memory cell is an even-numbered or odd-numbered cell. Herein, the even number or odd number of the memory cell is determined according to whether a memory cell is connected to an even-numbered or odd-numbered wordline. That is, the memory cell connected to the even-numbered wordline will be referred to as an even-numbered memory cell, and the memory cell connected to the odd-numbered wordline will be referred to as an odd-numbered memory cell, hereinafter.

Figure 5:
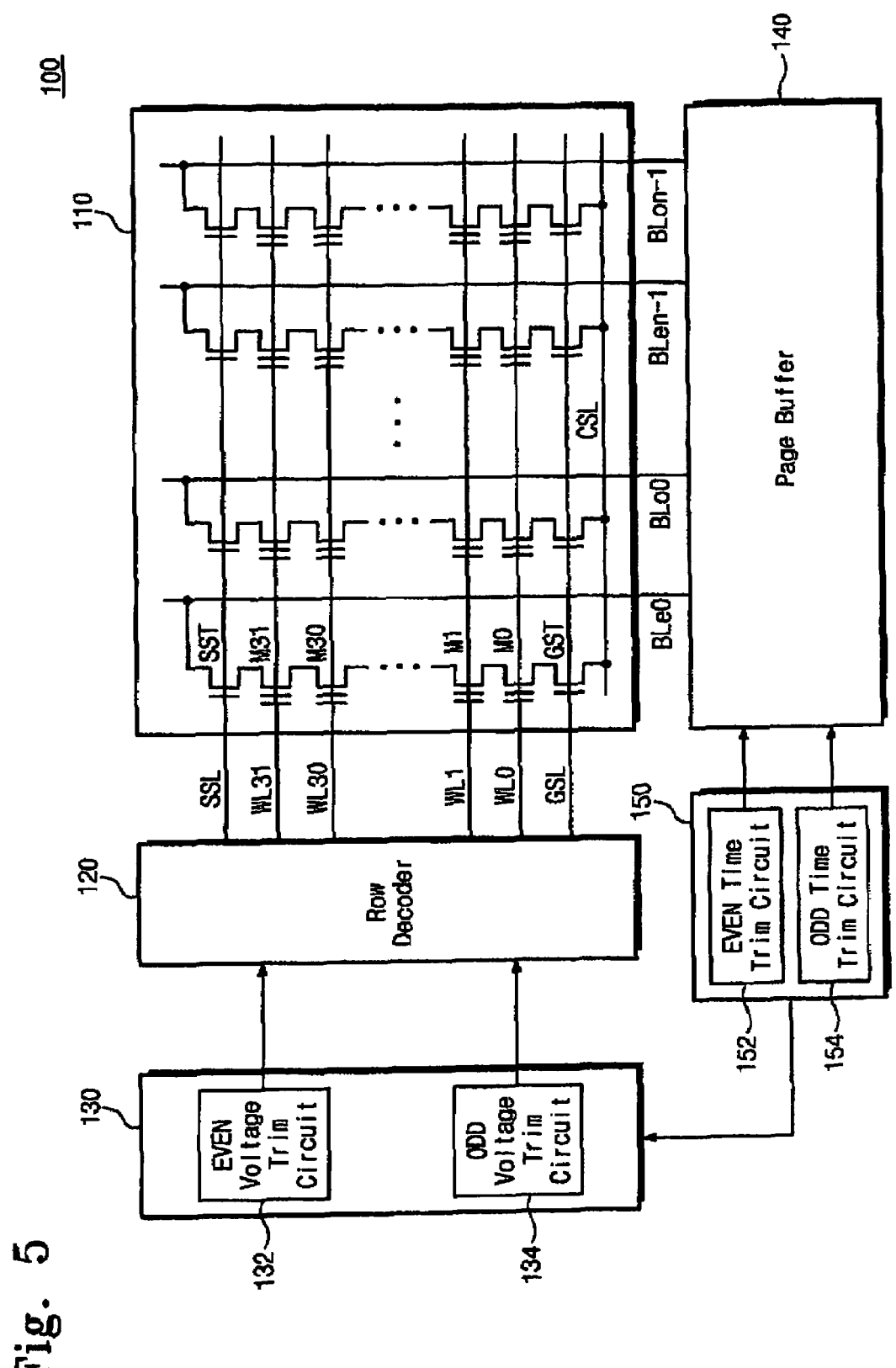
FIG. 5 is a functional block diagram of a nonvolatile memory device according to a first embodiment of the invention.

FIG. 5 is a functional block diagram of a nonvolatile memory device 100 according to the first embodiment of the present invention. The nonvolatile memory device 100 of FIG. 5 is a NAND flash memory device. However, it is obvious to those skilled in the art that the present invention is also applicable to other memory devices (e.g., mask read only memory (MROM), programmable ROM (PROM), ferroelectric random access memory (FRAM), NOR flash, and so forth) as well as the NAND flash memory device.

Referring to FIG. 5, the nonvolatile memory device 100 includes a memory cell array 110, a row decoder 120, a wordline voltage generator 130, a page buffer 140 and control logic 150. The memory cell array 110 of the present invention is prepared through a double patterning technique (DPT). The nonvolatile memory device 100 operates in different ways according to whether the memory cell is an even-numbered or odd-numbered cell. To this end, the wordline voltage generator 130 of the present invention provides respective program/read operating conditions suitable for threshold voltage distributions of the odd-numbered and even-numbered memory cells during program/read operations. The control logic 150 provides respective sensing operating conditions suitable for odd-numbered and even-numbered bitlines during read/verify operations. Here, the verify operation is a part of the program operation.

Figure 1:
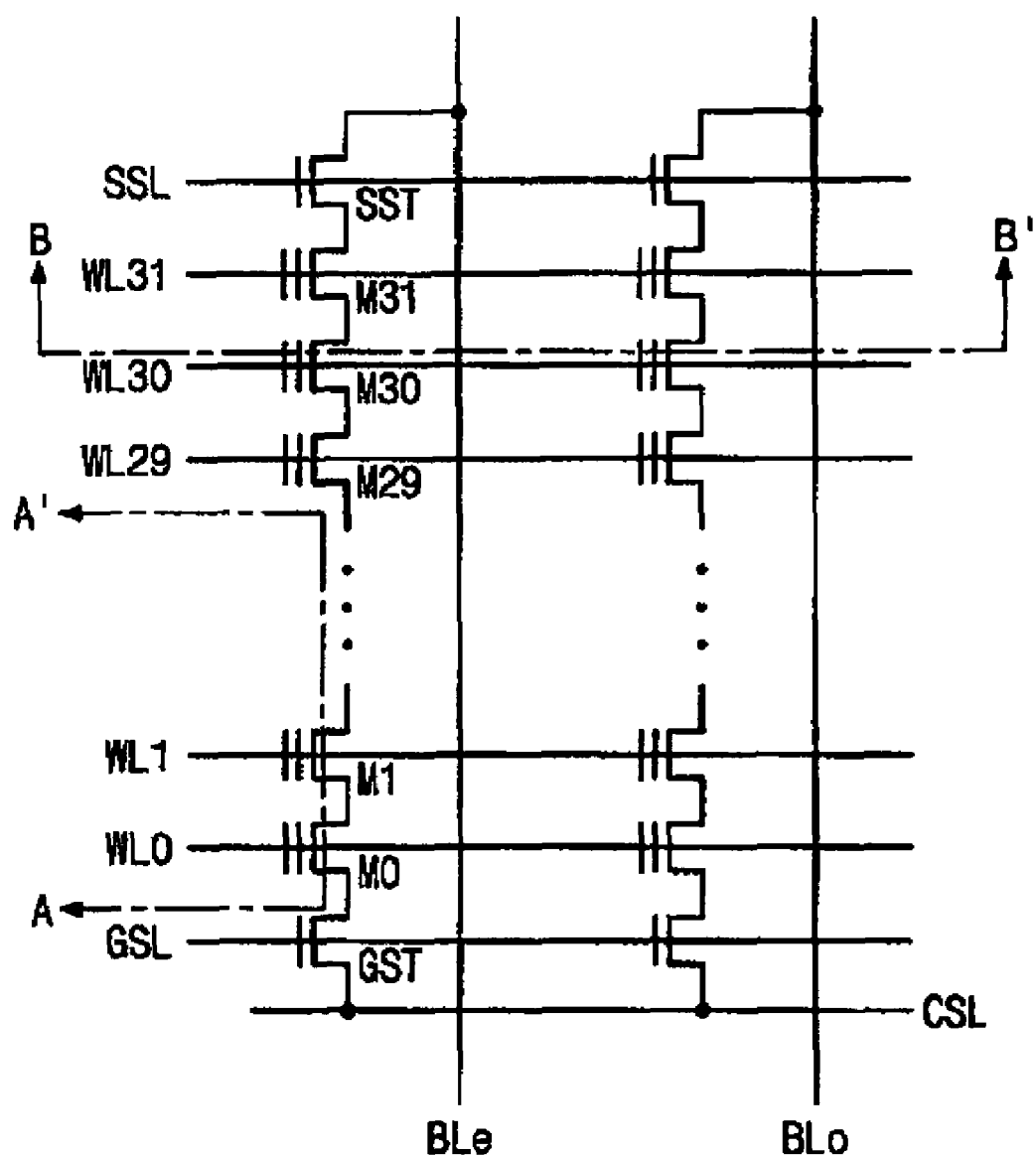
FIG. 1 is a circuit diagram of a memory cell array using a double patterning technique (DPT)
Figure 2A:
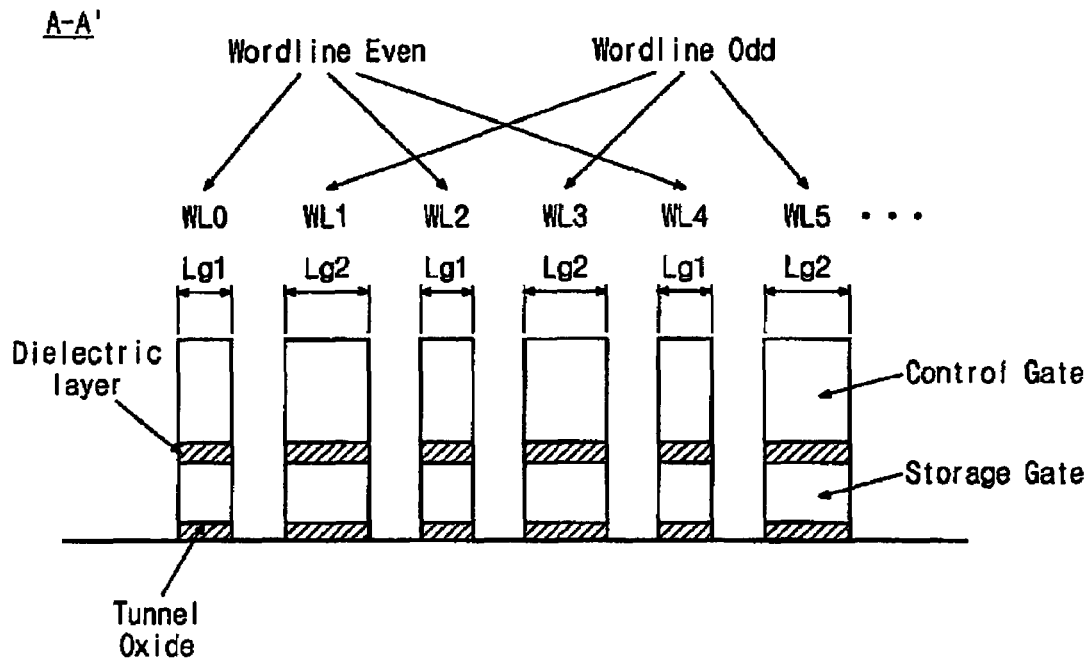
Figure 2B:
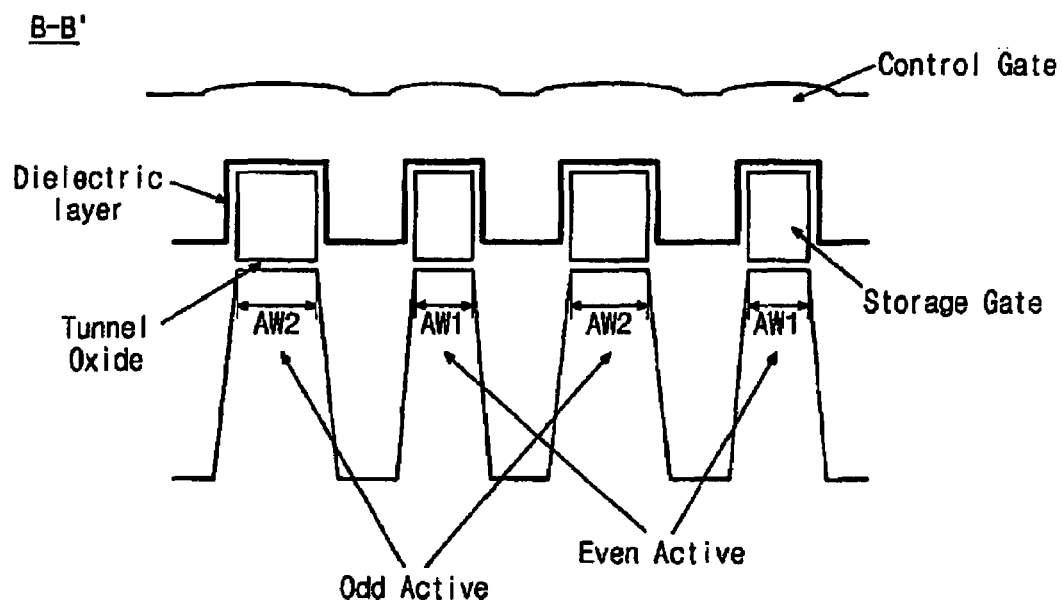
Figure 2C:
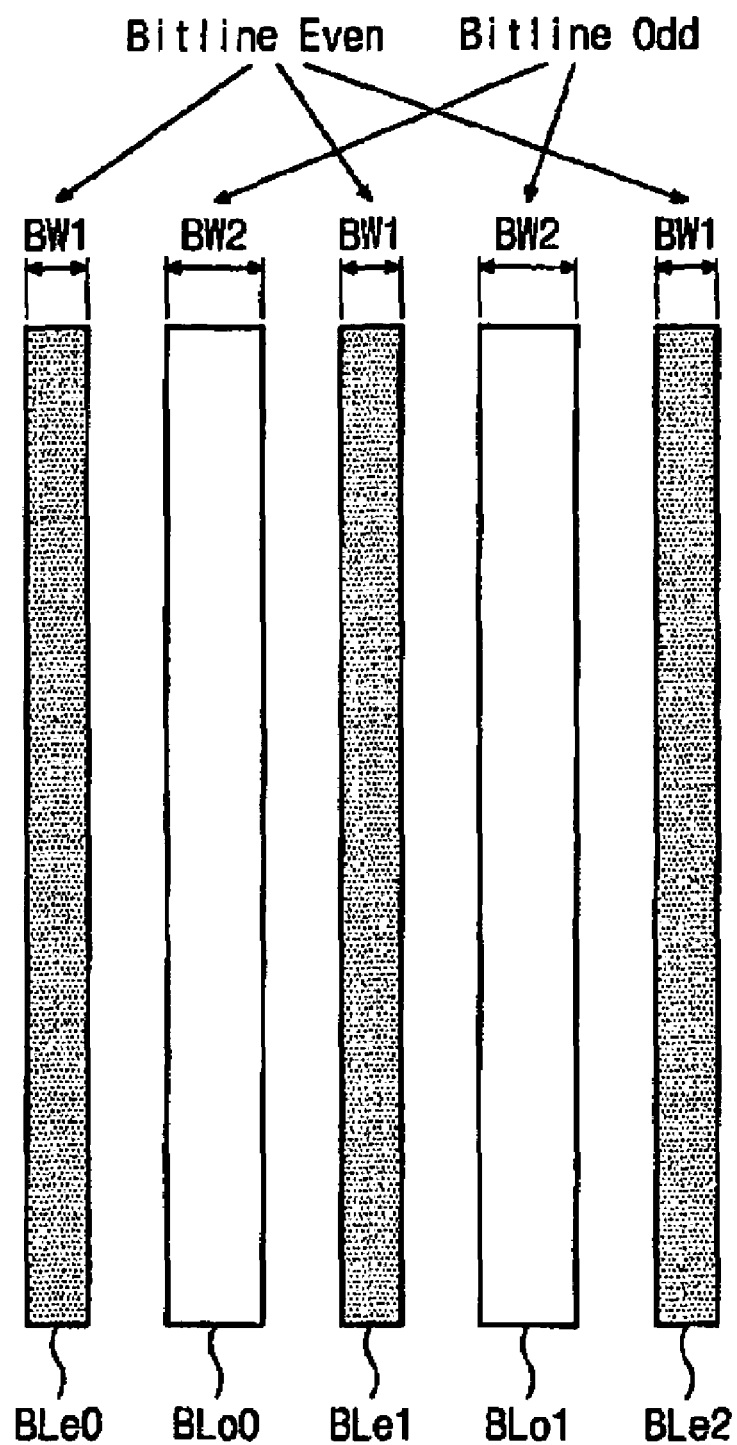

The memory cell array 110 includes multiple memory cells, and has the substantially same construction as the memory cell array of FIG. 1. The multiple memory cells included in the memory cell array 110 are arranged at regions where multiple wordlines WL0~WL31 and multiple bitlines BLe0~BLen−1 and BLo0~BLon−1 cross each other. Each of the memory cells stores 1-bit data or n-bit data where n is an integer of 2 or more.

The multiple wordlines WL0~WL31 are divided into even-numbered wordlines WL0, WL2 . . . WL30 and odd-numbered wordlines WL1, WL3 . . . WL31. Since the memory cell array 110 is prepared using the DPT, widths of the even-numbered wordlines WL0, WL2 . . . WL30 are different from those of the odd-numbered wordlines WL1, WL3 . . . WL31. In below, for convenience in description, it is assumed that line widths of the even-numbered bitlines BLe0~BLen−1 are narrower than those of the odd-numbered bitlines BLo0~BLen−1. Therefore, the memory cells of the memory cell array 110 are mainly classified into even-numbered memory cells and odd-numbered memory cells.

Each cell string (also referred to as NAND string) of the memory cell array 110 includes multiple floating gate transistors M0~M31. The multiple floating gate transistors M0~M31 are connected in series between a string select transistor SST and a ground select transistor GST arranged in the same string. The plurality of wordlines WL0~WL31 are arranged to cross the cell strings, i.e., NAND strings. The wordlines WL0~WL31 are respectively connected to control gates of the corresponding floating gate transistors M0~M31 of each NAND string. Program/read voltages are applied through the wordlines WL0~WL31, thereby programming/reading data to/from the corresponding floating gate transistors M0~M31. The nonvolatile memory device further includes a page buffer 140 to program/read data to/from the memory cell array 110.

The row decoder 120 decodes a row address supplied from a row address buffer (not shown) to select at least one of the multiple wordlines WL0~WL31. A wordline voltage is then applied to the selected wordline(s). Here, the wordline voltage is supplied from the wordline voltage generator 130. The row address corresponds to position data of the selected wordline. More specifically, the row address contains the position data signifying whether the selected wordline is an even-numbered one or an odd-numbered one.

The wordline voltage generator 130 generates the wordline voltage to be supplied to the selected wordline. Here, the wordline voltage may be a program voltage and a verify voltage during a program operation, may be a read voltage during a read operation, and may be an erase voltage during an erase operation. In particular, the wordline voltage generator 130 of the present invention includes an even voltage trim circuit 132 and an odd voltage trim circuit 134.

When the selected wordline is an even-numbered one, the even voltage trim circuit 132 adjusts the wordline voltage so as to supply a first program voltage, a first verify voltage or a first read voltage to the selected wordline. Here, the first program voltage, the first verify voltage and the first read voltage are suitable for threshold voltage distribution characteristics of the even-numbered memory cells, which will be more fully described with reference to FIG. 6 below.

When the selected wordline is an odd-numbered one, the odd voltage trim circuit 134 adjusts the wordline voltage so as to supply a second program voltage, a second verify voltage or a second read voltage to the selected wordline. Here, the second program voltage, the second verify voltage and the second read voltage are suitable for threshold voltage distribution characteristics of the odd-numbered memory cell, which will be also more fully described with reference to FIG. 6 below.

According to whether the memory cell is an even-numbered or odd-numbered memory cell, the wordline voltage generator 130 of the present invention supplies the program voltage, the verify voltage or the read voltage that is suitable for respective threshold voltage distribution characteristics of corresponding memory cells, to the selected wordline.

The page buffer 140 reads data through corresponding bitlines from the memory cells during the read/verify operations. The page buffer 140 drives the bitlines under control of the control logic 150. The data read during the read operation are outputted to the outside through an input/output circuit (not shown). The data read during the verify operation are outputted to a pass/fail detection circuit (not shown). The pass/fail detection circuit determines whether or not data outputted from the page buffer 140 during the program operation are equal to pass data. The pass/fail detection circuit outputs a pass/fail signal, a detection result of the program operation, to the control logic 150.

The control logic 150 controls the wordline voltage generator 130 and the page buffer 140 during the program/read/erase operations. The control logic 150 enables one of the even and odd voltage trim circuits 132 and 134 of the wordline voltage generator 130 according to an input address. Particularly, the control logic 150 of the present invention includes an even time trim circuit 152 and an odd time trim circuit 154 that have different bitline sensing operating conditions. Such different bitline sensing operating conditions are described below with reference to a precharge time and a cell current development time.

The even time trim circuit 152 controls the page buffer 140 such that the even-numbered bitlines BLe0~BLen−1 are sensed with a first precharge time and a first cell current development time. Likewise, the odd time trim circuit 154 controls the page buffer 140 such that the odd-numbered bitlines BLo0~BLon-1 are sensed with a second precharge time and a second cell current development time. This will be more fully described with reference to FIG. 7.

The control logic 150 controls the page buffer 140 such that the corresponding bitlines are sensed with appropriate precharge time and cell current development time according to whether the bitline is an even-numbered or odd-numbered bitline. That is, the control logic 150 controls the page buffer 140 to drive the bitlines with different bitline sensing operating conditions according to whether the bitline is an even-numbered or odd-numbered one.

The nonvolatile memory device 100 thus optimizes operation for even-numbered and odd-numbered memory cells. Specifically, in the nonvolatile memory device 100, the wordline may be driven with a program voltage, a verify voltage or a read voltage that is optimized for threshold voltage distributions according to whether the wordline is an even-numbered or odd-numbered wordline, and the bitline may be driven with a precharge time and a cell current development time that are optimized according to whether the bitline is an even-numbered or odd-numbered bitline.

Even though the memory cell has different threshold voltage distribution characteristics according to whether the memory cell is an even-numbered or odd-numbered one, the nonvolatile memory device 100 tailors operation for the threshold voltage distributions of the even-numbered or odd-numbered memory cell, resulting in an improvement of program/read/erase performances. The discussion below with reference to FIGS. 6-8 provides further detail on how the program/read/erase performances are improved in the nonvolatile memory device 100.

Figure 6A:
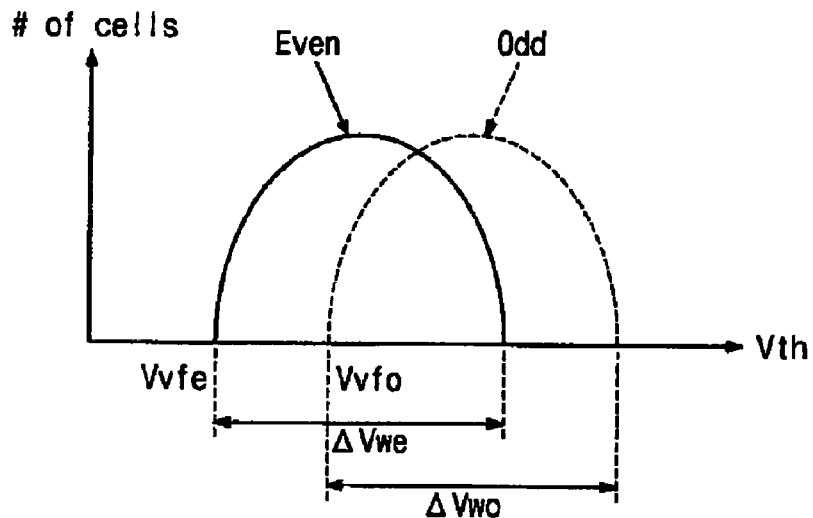
Figure 6B:
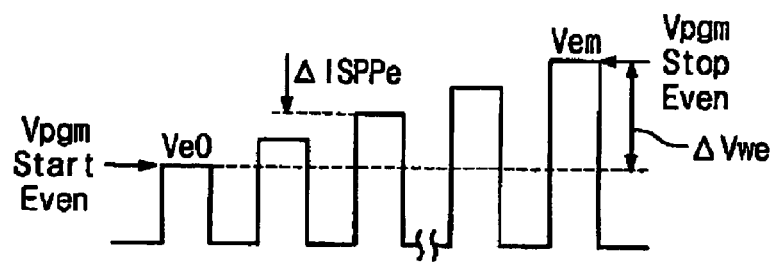
Figure 6C:
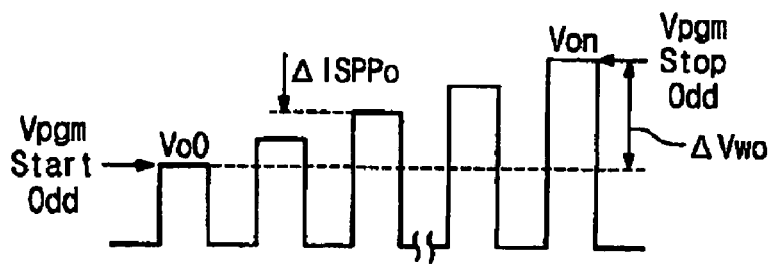
Figure 7:
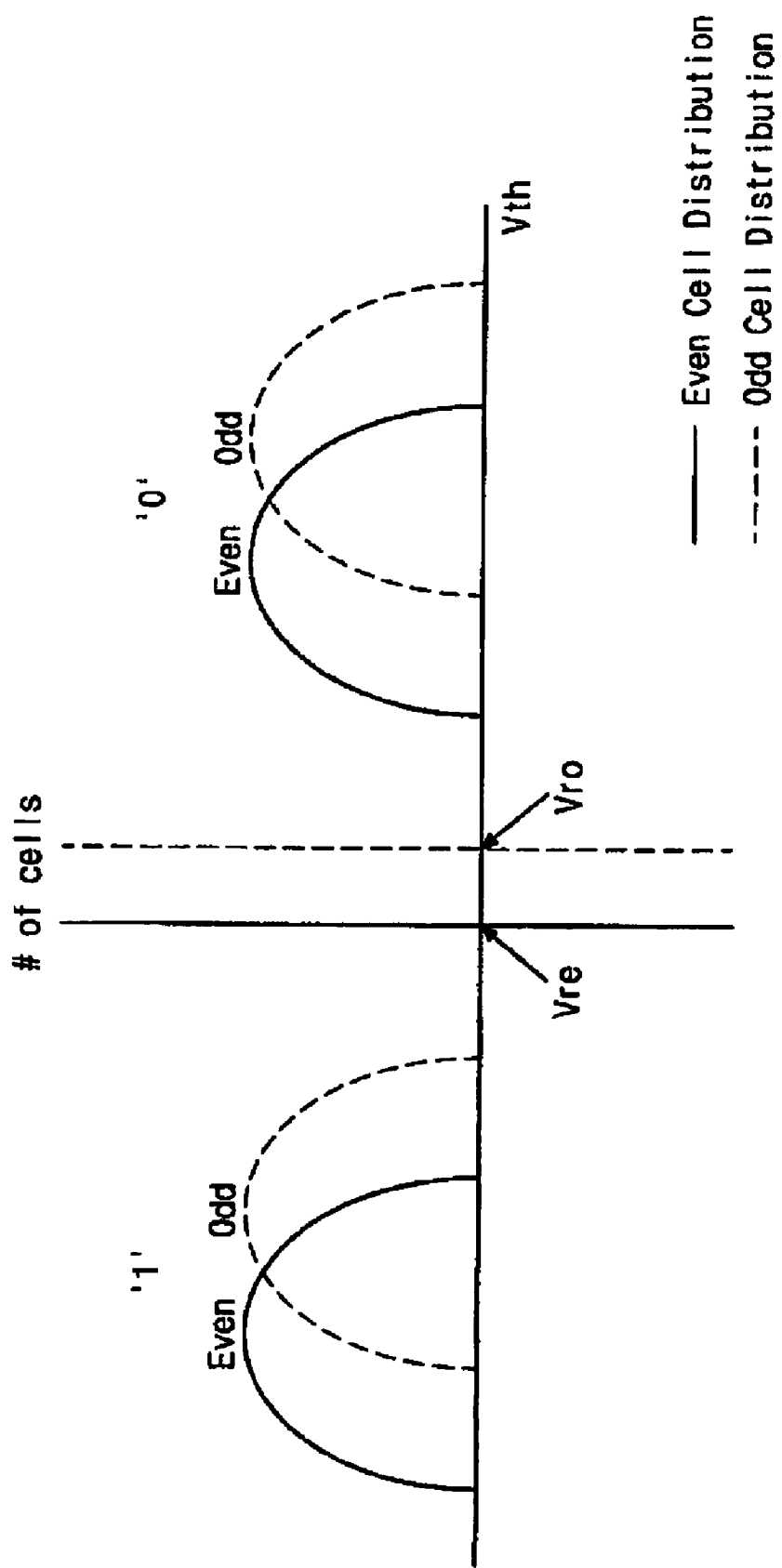
FIG. 7 is a graphical illustration of a read voltage of a nonvolatile memory device according to an embodiment of the invention.

FIGS. 6A through 6C are graphical illustrations of a voltage adjusting method of the nonvolatile memory device 100 of FIG. 5. FIG. 6A illustrates threshold voltage distribution characteristics according to whether a memory cell is an even-numbered or odd-numbered memory cell. Referring to FIG. 6A, the threshold voltage distribution of the odd-numbered memory cell is relatively higher than that of the odd-numbered memory cell. Although FIG. 6A illustrates that the threshold voltage distribution of the odd-numbered memory cell is higher than that of the even-numbered memory cell, the invention is not limited to such a case.

The nonvolatile memory device 100 may operate in program operating conditions that are optimized according to the distribution of the even-numbered memory cell and the distribution of the odd-numbered memory cell, respectively. The nonvolatile memory device 100 may be programmed by an incremental step pulse programming (ISPP) method. According to the ISPP method, a program voltage Vpgm incrementally increases step by step by an incremental voltage having a predetermined pulse width from a program start voltage to a program stop voltage during the repetition of a program cycle. Such an ISPP method is disclosed in a document, entitled "A 3.3V 32 Mb NAND Flash Memory with Incremental Step Pulse Programming Scheme", IEEE Journal of Solid-State Circuits, vol. 30, No. 11, Nov. 1995, pp. 1149-1156 (Suh, Kang-Deog, et al.), incorporated herein by a reference.

First, a programming method of the odd-numbered memory cell will be described. FIG. 6B illustrates a program operating condition according to the threshold voltage distribution of the even-numbered memory cell. Herein, the program operating condition includes a program start voltage Ve0, an ISPP incremental level ΔISPPe, a program stop voltage Vem and a first verify voltage Vvfe. The maximum number of times of program loops may be m. The threshold voltage distribution of the even-numbered memory cell satisfies following Equations 3 and 4.

$$Vem = Ve0 + m\Delta ISSPe \qquad \text{(Equation 3)}$$

$$\Delta Vwe = Vem - Ve0 \qquad \text{(Equation 4)}$$

Referring to FIG. 6B, the even-numbered memory cell is programmed with a first program operating condition. Here, the first program operating condition includes the first program start voltage Ve0, the first ISPP incremental level ΔISPPe, the first program stop voltage Vem and the first verify voltage Vvfe. Such a first program operating condition may be designed to be optimal for the threshold voltage distribution of the even-numbered memory cell. The first program operating condition may be provided from the even voltage trim circuit 132. During the program operation upon the even-numbered memory cell, the program voltage Vpgm with a voltage level sequentially increasing by the first ISPP incremental level ΔISPPe, is supplied to the corresponding wordline.

FIG. 6C illustrates a program operating condition according to the threshold voltage distribution of the odd-numbered memory cell. Herein, the program operating condition includes a second program start voltage Vo0, a second ISPP incremental level ΔISPPo, a second program stop voltage Von and a second verify voltage Vvfo. The maximum number of times of program loops may be n. The second program start voltage Vo0 is higher than the first program start voltage Ve0. However, it is unnecessary for the second program start voltage Vo0 to be higher than the first program start voltage Ve0. The threshold voltage distribution of the odd-numbered memory cell satisfies following Equations 5 and 6.

$$Von = Vo0 + n\Delta ISSPo \qquad \text{(Equation 5)}$$

$$\Delta Vwo = Von - Vo0 \qquad \text{(Equation 6)}$$

Referring to FIG. 6C, the odd-numbered memory cell is programmed with a second program operating condition. Here, the second program operating condition includes the second program start voltage Vo0, the second ISPP incremental level ΔISPP0, the second program stop voltage Von and the second verify voltage Vvfo. Such a second program operating condition may be designed to be optimal for the threshold voltage distribution of the odd-numbered memory cell. The second program operating condition may be provided from the odd voltage trim circuit 134. During the program operation upon the even-numbered memory cell, the program voltage Vpgm with a voltage level sequentially increasing by the second ISPP incremental level ΔISPPo, is supplied to the corresponding wordline.

Referring to FIGS. 6A and 6B, the program operation of the nonvolatile memory device 100 is performed under respective program operating conditions depending on the threshold voltage distributions of the odd-numbered and even-numbered memory cells. That is, the program start voltages Ve0 and Vo0, the ISPP incremental levels ΔISPPe and ΔISPPo, the program stop voltages Vem and Von, and the maximum number m and n of the program loops are different according to whether the memory cell to be driven is an odd-numbered or even-numbered memory cell.

Figure 3:
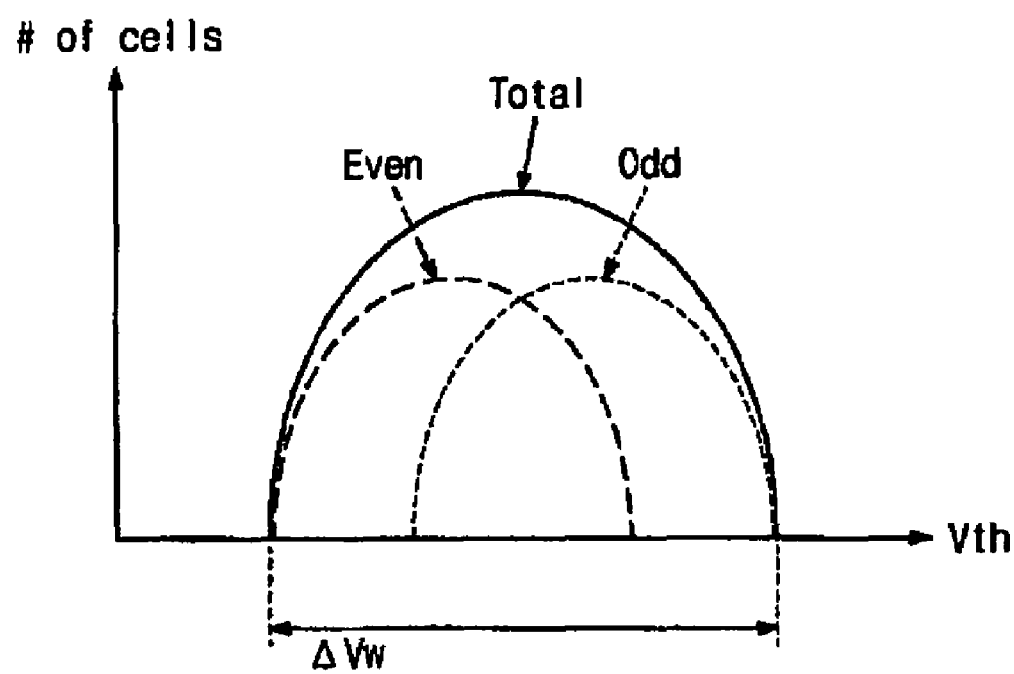
FIG. 3 is a graphical illustration of threshold voltage distributions of memory cells manufactured according to DPT.
Figure 3:
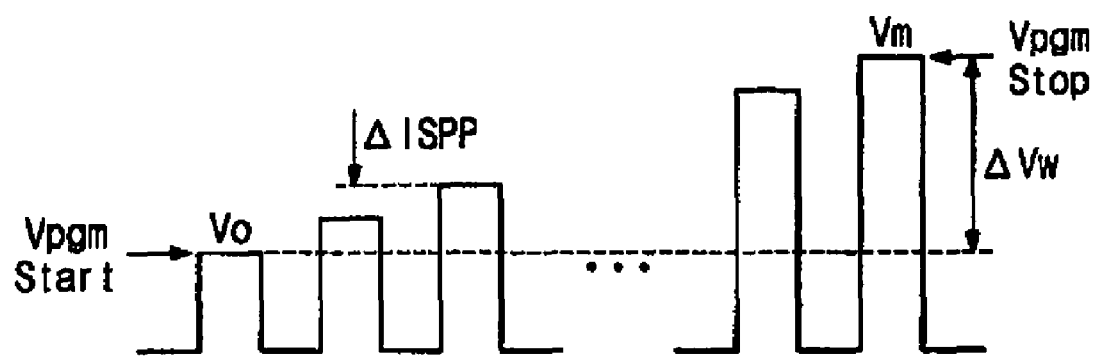

In the conventional nonvolatile memory device illustrated in FIG. 3, the program operating condition is determined based on a width ΔVw of a total threshold voltage distribution in program operation. However, in embodiments of the invention, the program operation of the nonvolatile memory device 100 is performed under the program operating condition suitable for the threshold voltage distribution characteristics of the memory cell to be driven. In particular, the program operating conditions are respectively determined based on a width ΔVwe of a threshold voltage distribution of the even-numbered memory cell and a width ΔVwo of a threshold voltage distribution of the odd-numbered memory cell. Accordingly, the programming time of the inventive nonvolatile memory device 100 is shorter than that of the conventional nonvolatile memory device where the program operating condition is determined based on the width ΔVw of the total threshold voltage distribution. Further, in embodiments of the invention, the number of program loops may be smaller than that of the conventional nonvolatile memory device. Therefore, it is possible to improve reliability of the memory cell.

FIG. 7 is a graphical illustration of a read voltage of a nonvolatile memory device 100 according to an embodiment of the invention. Referring to FIG. 7, the threshold voltage distributions of the memory cells are mainly divided into those of the even-numbered memory cells and those of the odd-numbered memory cells. As illustrated in FIG. 7, the threshold voltage distribution of the odd-numbered memory cell is relatively higher than that of the even-numbered memory cell. Therefore, in the nonvolatile memory device of the present invention, a read voltage for data decision differs according to whether the memory cell is an even- or odd-numbered one. For example, a read voltage Vro of the odd-memory cell is higher than a read voltage Vre of the even-numbered memory cell. Herein, the read voltages Vro and Vre may be applied from the voltage trim circuits 134 and 132, respectively, of the wordline voltage generator 130.

In the nonvolatile memory device 100, the read voltages to be supplied to the wordline are different from each other according to whether the memory cell is an odd-numbered or even-numbered memory cell. Also, the nonvolatile memory device 100 may be implemented such that erase voltages are different from each other according to whether the memory cell is an odd-numbered or even-numbered memory cell.

Figure 4:
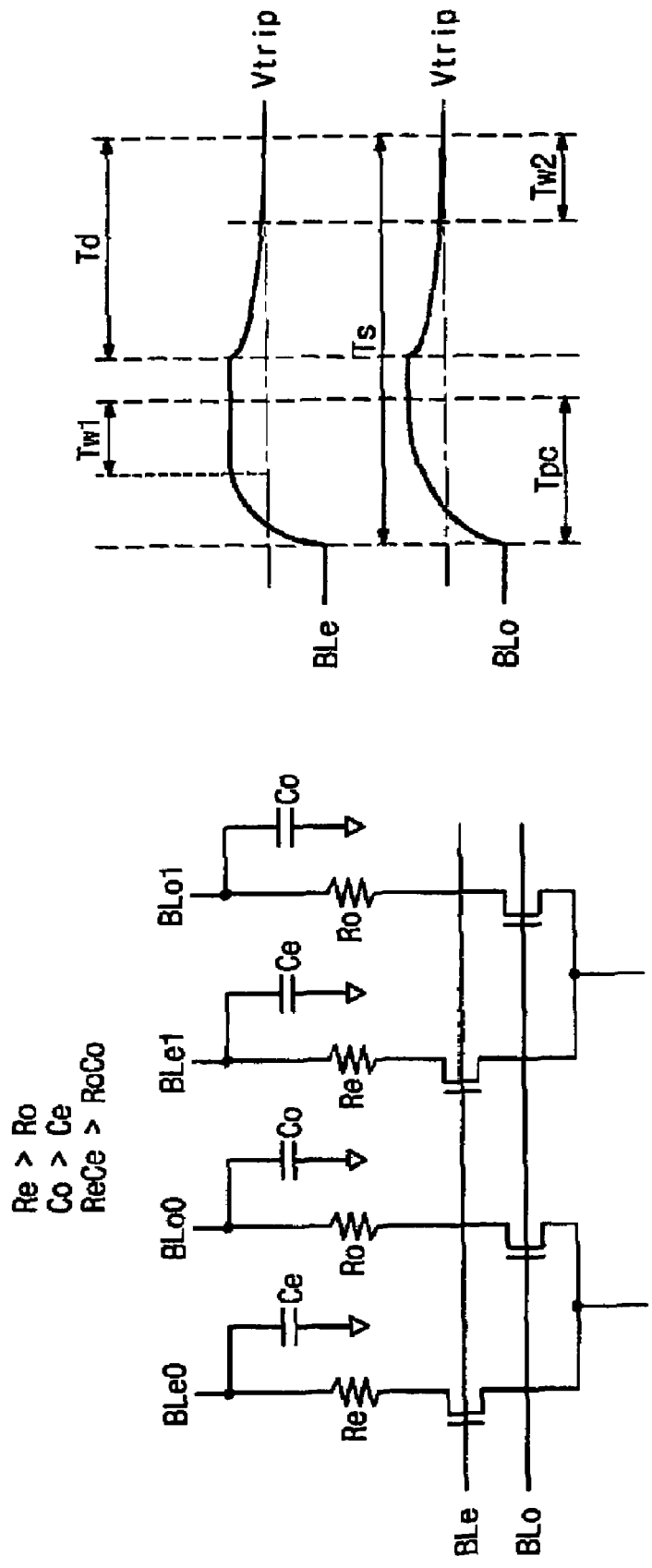
FIG. 4 is an equivalent circuit diagram and an associated voltage-time curves for a conventional bitline structure and sensing method.
Figure 8A:
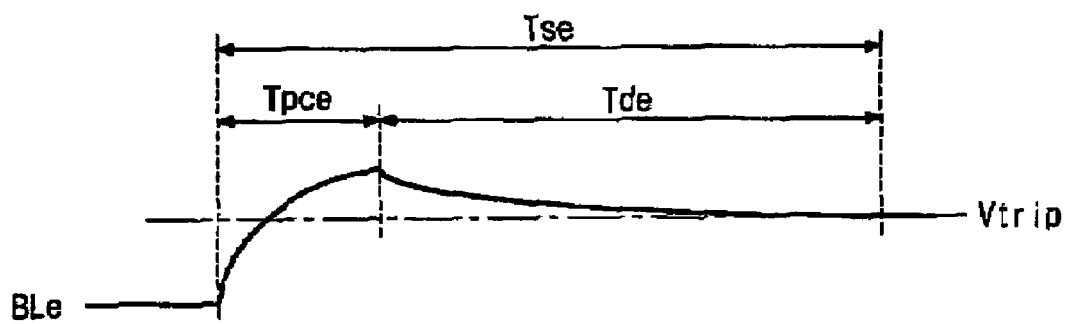
FIGS. 8A and 8B are graphical illustrations of voltage-time curves for bitline sensing in a nonvolatile memory device according to an embodiment of the invention.
Figure 8B:
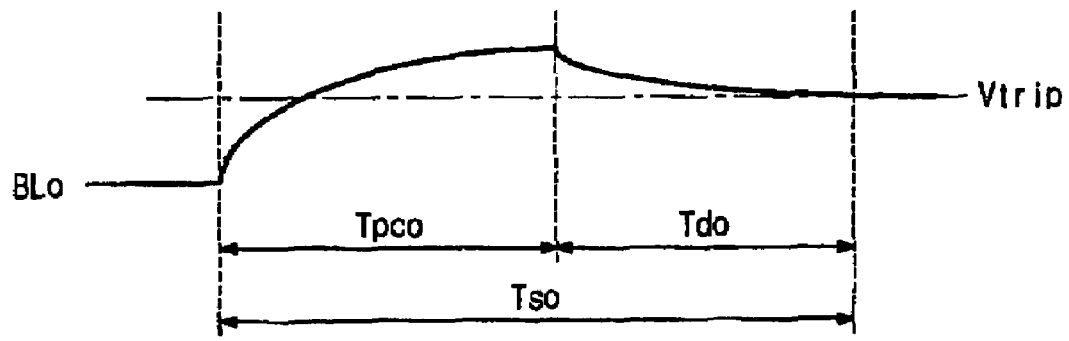

FIGS. 8A and 8B are graphical illustrations of voltage-time curves for bitline sensing in the nonvolatile memory device 100 according to an embodiment of the invention. The conventional time-trimming method for bitline sensing as illustrated in FIG. 4 was equally applied regardless of whether the bitline is an even-numbered or odd-numbered bitline. Referring to FIGS. 8A and 8B, however, the inventive time-trimming method for bitline sensing is performed under bitline sensing operating conditions (e.g., precharge time, development time and sensing time) which differ according to whether the bitline is an even-numbered or odd-numbered bitline.

Generally, the bitline sensing operation is performed to read data from the memory cell during a read/verify operation of the nonvolatile memory device 100. The bitline sensing operation is mainly divided into a bitline precharge section, a bitline development section and a data sensing section. The bitlines are precharged to a predetermined voltage level during the bitline precharge section. During the bitline development section, a bitline voltage changes according to whether the memory cells connected to the bitlines are turn-off cells or turn-on cells.

For example, if the memory cell is the turn-on cell, charges accumulated in the bitline are discharged through the memory cell, so that the bitline voltage decreases. On the contrary, if the memory cell is the turn-off cell, the bitline is maintained at a predetermined voltage. During the data sensing section, the memory cells connected to the bitlines are determined to be the turn-on cells or turn-off cells by sensing voltages of developed bitlines.

Specifically, FIG. 8A illustrates a time-trimming method for sensing the even-numbered bitlines. Referring to FIGS. 5 and 8B, the time-trimming method for sensing the even-numbered bitlines is as follows. The even time trim circuit 152 operates with a first sensing operating condition. The first sensing operating condition includes a first precharge time Tpce and a first cell current development time Tde. The first sensing time Tse is equal to the sum of the first precharge time Tpce and the first cell current development time Tde. The first cell current development time Tde is equal to the cell current development time Td of the conventional nonvolatile memory device as illustrated in FIG. 4. Therefore, because the waiting time (Tw1) illustrated in FIG. 4 is not required in the nonvolatile memory device 100, the total sensing time Tse is shorter than the sensing time (Ts) of the conventional nonvolatile memory device illustrated in FIG. 4.

FIG. 8B illustrates a time-trimming method for sensing the odd-numbered bitlines. Referring to FIGS. 5 and 8B, the time-trimming method for sensing the odd-numbered bitlines is as follows. The odd time trim circuit 154 operates with a second sensing operating condition. The second sensing operating condition includes a second precharge time TCU and a second cell current development time Tdo. The second sensing time Tso is equal to the sum of the second precharge time Tpco and the second cell current development time Tdo. The second precharge time Tpco is equal to the precharge time Tpc of the typical nonvolatile memory device as illustrated in FIG. 4. The second cell current development time Tdo is shorter than the typical cell current development time (Td) illustrated in FIG. 4. Therefore, because the waiting time (Tw2) illustrated in FIG. 4 is not required, the second sensing time Tso is shorter than the sensing time (Ts) of the conventional nonvolatile memory device illustrated in FIG. 4.

As described above, the even time trim circuit 152 provides the first precharge time Tpce and the first cell current development time Tde, which are optimized for sensing the even-numbered bitlines. The odd time trim circuit 154 provides the second precharge time Tpco and the second cell current development time Tdo, which are optimized for sensing the odd-numbered bitlines. Therefore, the nonvolatile memory device 100 can reduce the total bitline sensing time in comparison with that of the conventional nonvolatile memory device.

Since the even-numbered bitlines BLe0~BLen−1 have smaller widths than the odd-numbered bitlines BLo0~BLen−1, the former are precharged faster than the latter. Furthermore, because the even-numbered bitlines BLe0~BLen−1 are smaller in cell current than the odd-numbered bitlines BLo0~BLen−1, the former need to perform the development for a relatively longer duration than the latter. Accordingly, the first precharge time Tse is shorter than the second precharge time Tso. On the other hand, the first cell current development time Tde is longer than the second cell current development time Tdo. Hence, there is no great difference in the total sensing time. That is, the even sensing time Tse is similar in duration to the odd sensing time Tso.

In the nonvolatile memory device 100, the sensing operation is performed under the sensing operating condition that is optimized according to whether the bitline is an even-numbered or odd-numbered bitline. Therefore, the total sensing time required for sensing the bitlines decreases, thus reducing a time taken for the read/verify operation to be performed in the nonvolatile memory device 100.

Figure 9:
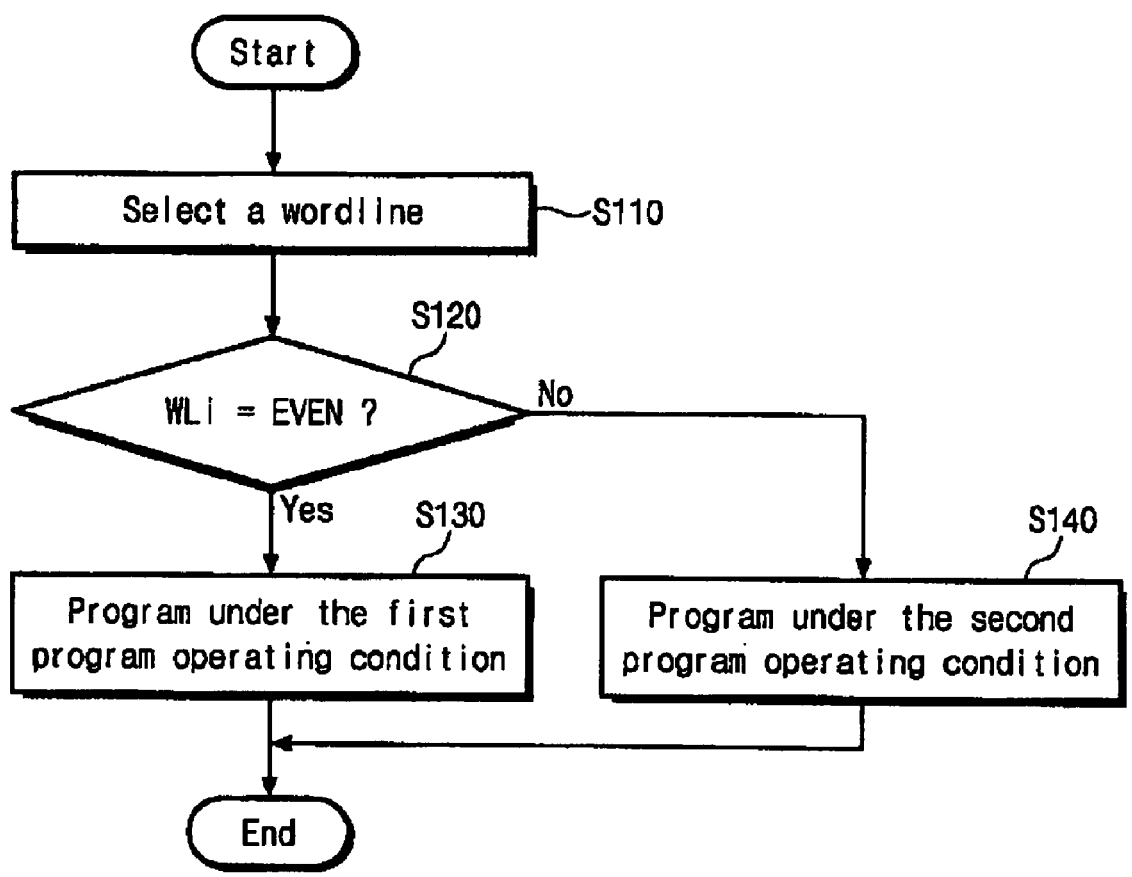
FIG. 9 is a flowchart illustrating a programming method of a nonvolatile memory device according to an embodiment of the invention.

FIG. 9 is a flowchart illustrating a programming method of the nonvolatile memory device 100 according to an embodiment of the invention. Referring to FIGS. 5 and 9, the programming method of the nonvolatile memory device 100 is as follows. In operation S110, the row decoder 120 decodes a row address to select a wordline corresponding thereto. At the same time, the row address is also transferred to the wordline voltage generator 130. In operation S120, the wordline voltage generator 130 determines whether the selected wordline is an odd-numbered or even-numbered wordline using the transferred row address. In operation S130, if the selected wordline is an even-numbered one, the program operation is performed under the first program operating condition supplied from the even voltage trim circuit 132. In operation S140, if the selected wordline is an odd-numbered one, the program operation is performed under the second program operating condition supplied from the odd voltage trim circuit 134.

Figure 10:
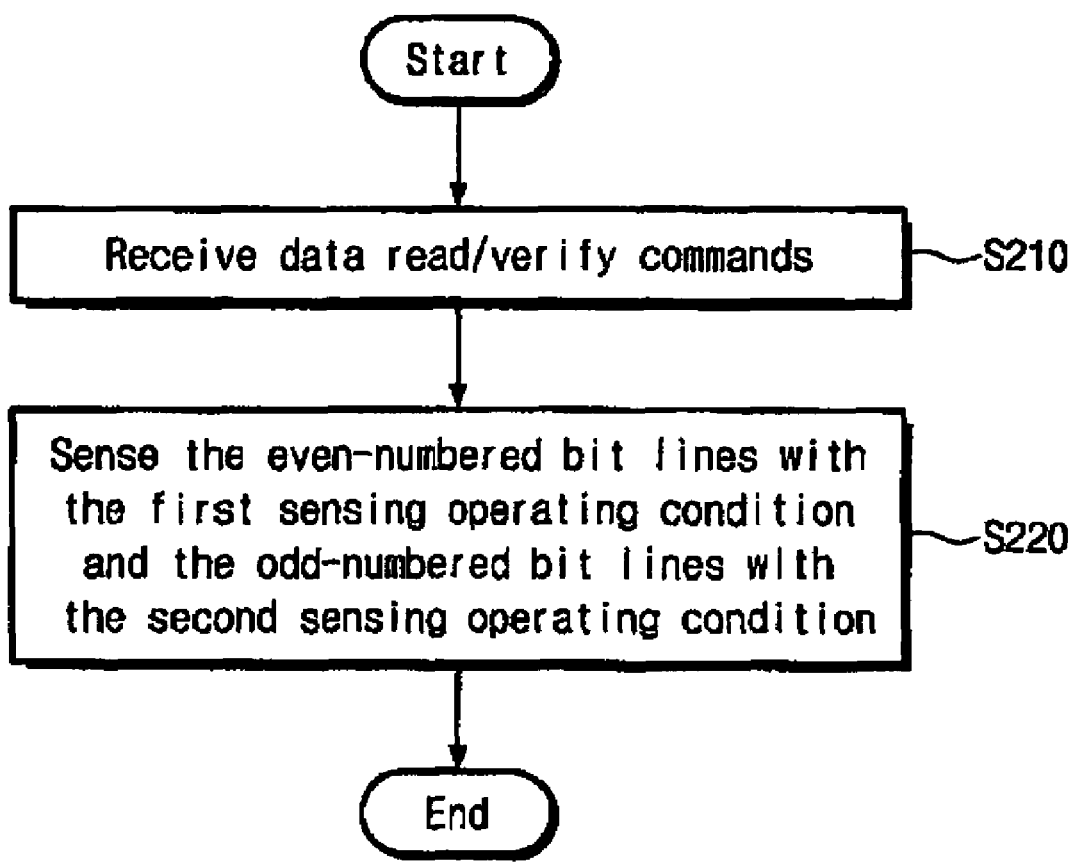
FIG. 10 is a flowchart illustrating a bitline sensing method of a nonvolatile memory device according to an embodiment of the invention.

FIG. 10 is a flowchart illustrating a bitline sensing method of the nonvolatile memory device 100 according to an embodiment of the invention. Referring to FIGS. 5 and 10, the bitline sensing method of the nonvolatile memory device 100 is as follows. In operation S210, the control logic 150 receives data read/verify commands from the outside. In operation S220, the even time trim circuit 152 of the control logic 150 controls the page buffer 140 such that the even-numbered bitlines are sensed with the first sensing operating condition, and the odd time trim circuit 154 of the control logic 150 controls the page buffer 140 such that the odd-numbered bitlines are sensed with the second sensing operating condition.

According to the first embodiment of the invention described above, the nonvolatile memory device operates in respective ways according to whether the memory cell is an even-numbered or odd-numbered memory cell. Specifically, in the nonvolatile memory device 100 according to an embodiment of the invention, the wordlines are driven under program/read/verify/erase operating conditions that are optimized for program distributions according to whether the memory cell is an even-numbered or an odd-numbered memory cell. The bitlines are driven under the sensing operating conditions that are optimized according to whether the bitline is an even-numbered or an odd-numbered bitline. Accordingly, it is possible to improve the threshold voltage distribution of the memory cell and performance degradation caused by a difference in a structural position of the memory cell.

Embodiments of the invention are also applicable to a nonvolatile memory device having a three-dimensional memory array structure. In such a device, respective layers of the memory array may have different threshold voltage distributions and performance characteristics. Such a three-dimensional array structure has been disclosed in U.S. Pat. No. 5,835,396 (Dec. 7, 1998), entitled "THREE-DIMENSIONAL READ-ONLY MEMORY", U.S. Pat. No. 6,034,882 (Mar. 7, 2000), entitled "VERTICALLY STACKED FIELD PROGRAMMABLE NONVOLATILE MEMORY AND METHOD OF FABRICATION", and U.S. Pat. No. 7,002,825 (Feb. 21, 2006), entitled "WORDLINE ARRANGEMENT HAVING SEGMENTED WORDLINES", respectively, which will be incorporated herein by reference. In embodiments of the invention, a nonvolatile memory device may be configured to operate in different ways according to each layer of the memory array.

Figure 11:
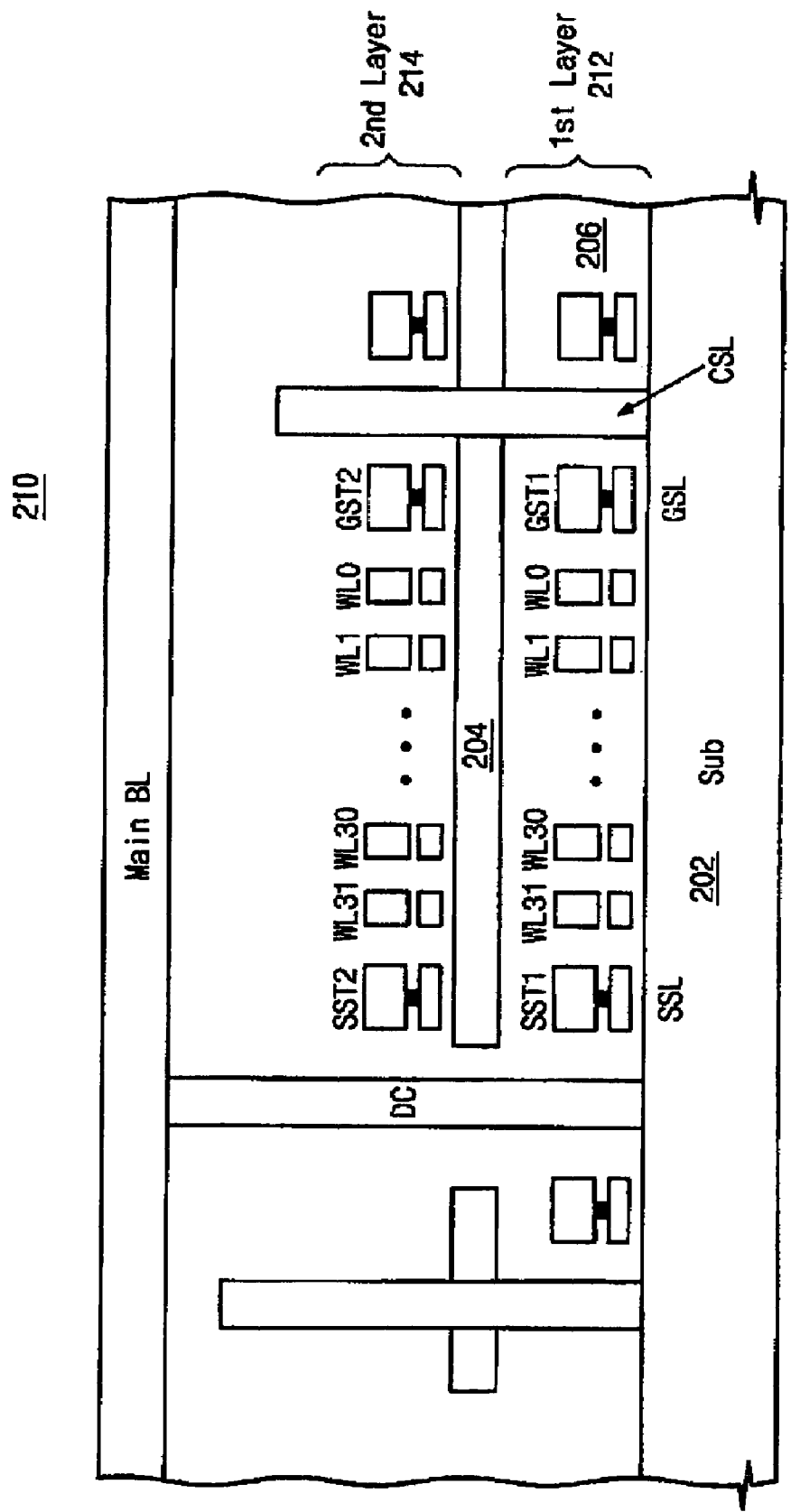
FIG. 11 is a sectional view illustrating a three-dimensional memory array of a nonvolatile memory device according to an embodiment of the invention.

FIG. 11 is a sectional view illustrating a three-dimensional (3-D) memory array 210 according to an embodiment of the invention. The 3-D memory array 210 may be a flash memory array, a read only memory (ROM) array, a static random access memory (SRAM) array, a silicon-oxide-nitride-oxide-silicon (SONOS) memory array, or the like. Referring to FIG. 11, although the 3-D memory array 210 has a first layer 212 and a second layer 214, the invention is not necessarily limited to a two-layered memory array structure.

The memory array 210 includes a substrate 202 formed of silicon or the like. One or more memory material layers 204 (one shown) are provided at different levels in the memory array 210. In particular, the memory material layer 204 is stacked above the substrate 202. An insulation layer 206 such as an oxide layer is disposed between each of the multiple memory material layers 204 so as to separate the memory material layers 204. The insulation layer 206 may include bulk dielectric layers such as borosilicate glass (BSG), phosphosilicate glass (PSG) and borophosphosilicate glass (BPSG).

Referring to FIG. 11, memory cells of a first memory array of the first layer 212 are disposed on the substrate 202, and memory cells of a second memory array of the second layer 214 are disposed on the material layer 204. Therefore, threshold voltage distributions of the memory cells belonging to the first memory array differ from those of the memory cells belonging to the second memory array. The nonvolatile memory device may be configured to operate with operating conditions that are optimized for each layer of the multi-layered memory array 210.

Figure 12:
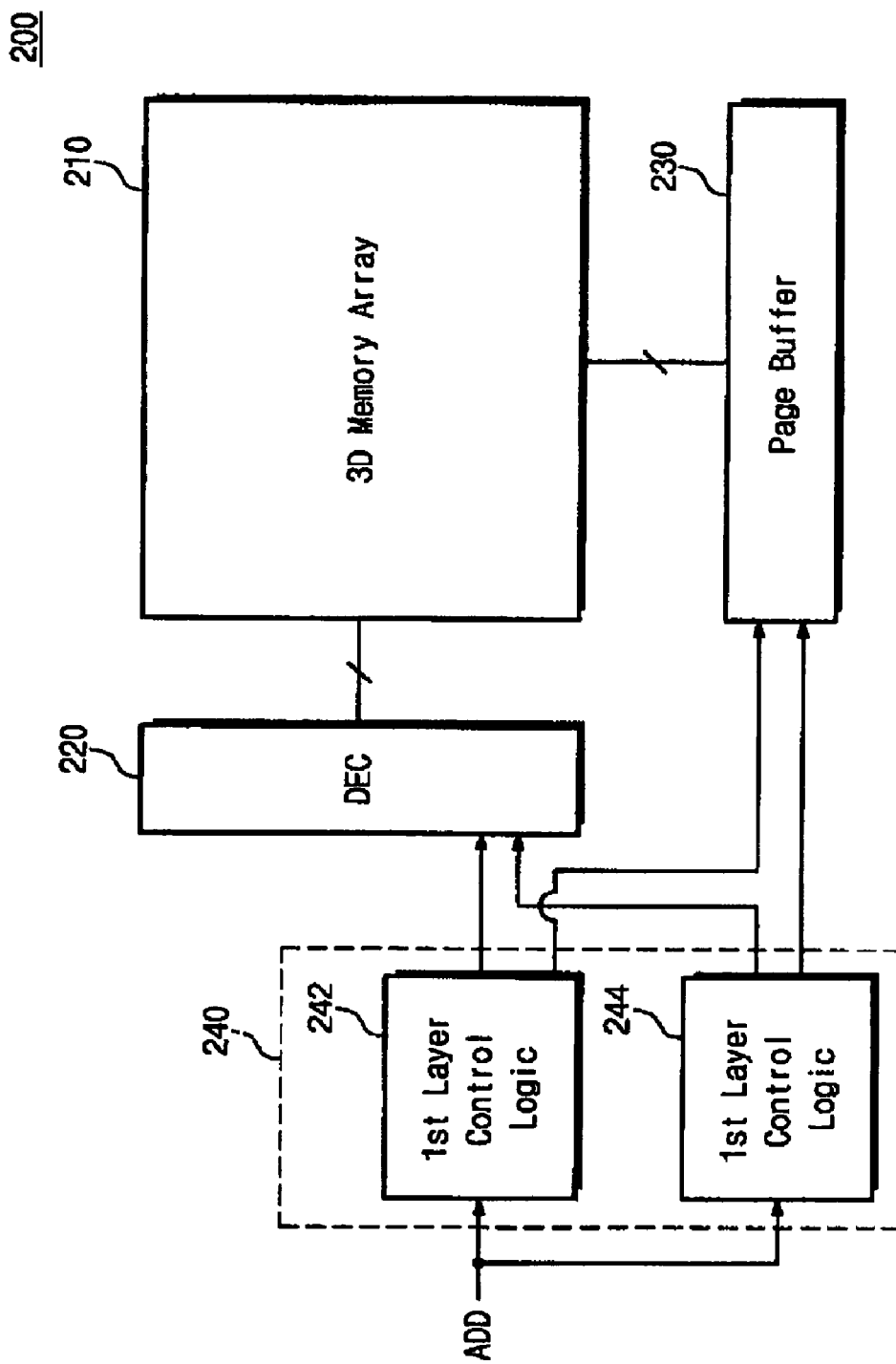
FIG. 12 is a functional block diagram of a nonvolatile memory device according to a second embodiment of the invention.

FIG. 12 is a functional block diagram of a nonvolatile memory device 200 according to a second embodiment of the present invention. Referring to FIG. 12, the nonvolatile memory device 200 includes a 3-D memory array 210, a decoder 220, a page buffer 230 and control logic 240. The 3-D memory array 210 is as described above with reference to FIG. 11. The nonvolatile memory device 200 includes control logic 240 that is configured to control the memory cells according to whether the memory cell corresponding to an address ADD belongs to the first layer 212 of the memory array 210 or the second layer 214 of the memory array 210. Specifically, the control logic 240 includes a first layer control logic 242 configured to control the memory cells belonging to the first layer 212, and a second layer control logic 244 configured to control the memory cells belonging to the second layer 214.

Figure 13A:
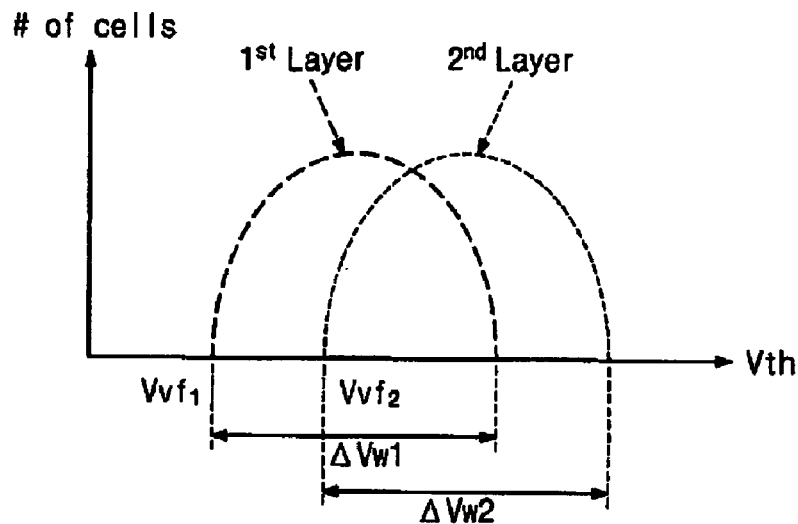
Figure 13B:
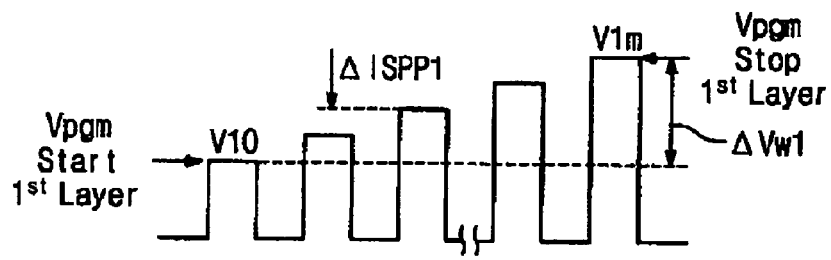
Figure 13C:
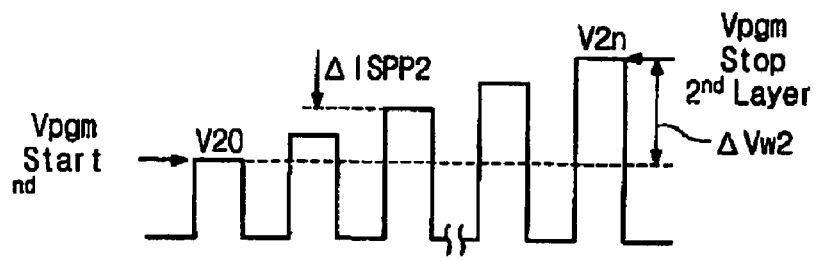

FIGS. 13A-13C are graphical illustrations of a programming method of the nonvolatile memory device 200 of FIG. 12. In particular, FIG. 13A is a graphical illustration of threshold voltage distributions of memory cells belonging to the first layer 212 and the second layer 214. Generally, the memory cells disposed on the material layer 204 have poorer threshold voltage characteristics than the memory cells disposed on the substrate 202. Therefore, the threshold voltage of memory cells in the first layer 212 may be higher than that of the memory cells in the second layer 214.

FIG. 13B is a graphical illustration of a program operating condition according to the threshold voltage distribution of the memory cell of the first layer 212 of the memory array 210. The program operating condition includes a program start voltage V10, an ISPP incremental level $\Delta$ISPP1, a program stop voltage V1m and a first verify voltage Vvf1. The maximum number of times of program loops may be m. The threshold voltage distribution of the memory cell in the first layer satisfies following Equations 7 and 8.

$$V1m = V10 + m\Delta ISSP1 \quad \text{(Equation 7)}$$

$$\Delta Vw1 = V1m - V10 \quad \text{(Equation 8)}$$

Referring to FIG. 13B, the memory cells of the first layer 212 are programmed with a first program operating condition. Here, the first program operating condition includes a first program start voltage V10, a first ISPP incremental level $\Delta$ISPP1, a first program stop voltage V1m and a first verify voltage Vvf1. Such a first program operating condition may be optimized for the threshold voltage distribution of the memory cells in the first layer 212. The first program operating condition may be provided from the first layer control logic 242. When programming upon the memory cells in the first layer 212, a program voltage Vpgm with a voltage level sequentially increasing by the first ISPP incremental level $\Delta$ISPP1, may be supplied to a corresponding wordline.

FIG. 13C is a graphical illustration of a program operating condition according to the threshold voltage distribution of the memory cell of the second layer 214 of the memory array 210. Here, the program operating condition includes a second program start voltage V20, a second ISPP incremental level $\Delta$ISPP2, a second program stop voltage V2n and a second verify voltage Vvf2. The maximum number of times of program loops may be n. The threshold voltage distribution of the memory cell in the second layer satisfies following Equations 9 and 10.

$$V2n = V20 + n\Delta ISSP2 \quad \text{(Equation 9)}$$

$$\Delta Vw2 = V2n - V20 \quad \text{(Equation 10)}$$

Referring to FIG. 13C, the memory cells of the second layer 214 are programmed with a second program operating condition. Here, the second program operating condition includes a second program start voltage V20, a second ISPP incremental level $\Delta$ISPP2, a second program stop voltage V2n and a second verify voltage Vvf2. Such a second program operating condition may be optimized for the threshold voltage distribution of the memory cells in the second layer 214. The second program operating condition may be provided from the second layer control logic 244. When programming upon the memory cells in the second layer 214, a program voltage Vpgm with a voltage level sequentially increasing by the second ISPP incremental level $\Delta$ISPP2, may be supplied to a corresponding wordline.

The nonvolatile memory device 200 is configured to determine whether the memory cells being addressed belong to the first layer 212 or the second layer 214. The memory cells are programmed with different program operating conditions based on the identified layer of the memory array 210. Therefore, the nonvolatile memory device 200 optimizes program operating conditions for the threshold voltage distributions of the memory cells in the first layer 212 and the second layer 214.

Figure 14A:
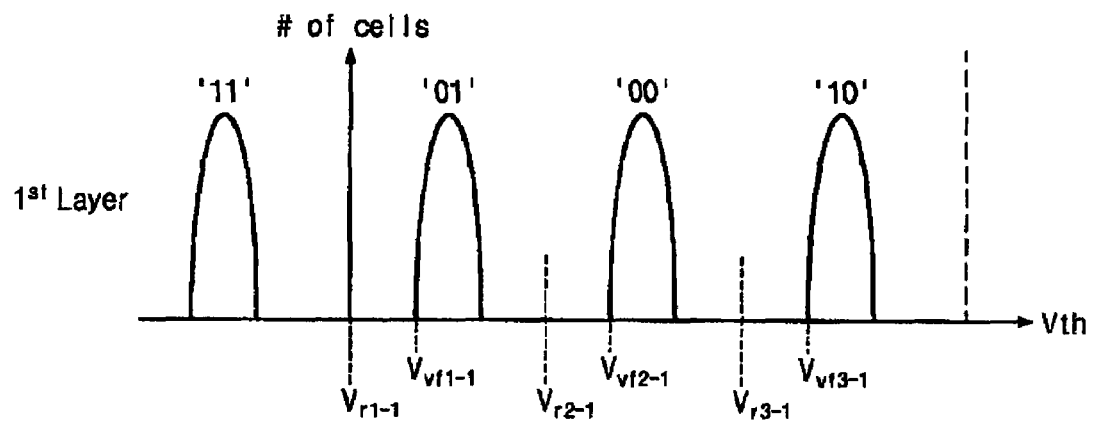
FIGS. 14A and 14B are graphical illustrations of read/verify voltages of the nonvolatile memory device in FIG. 12.
Figure 14B:
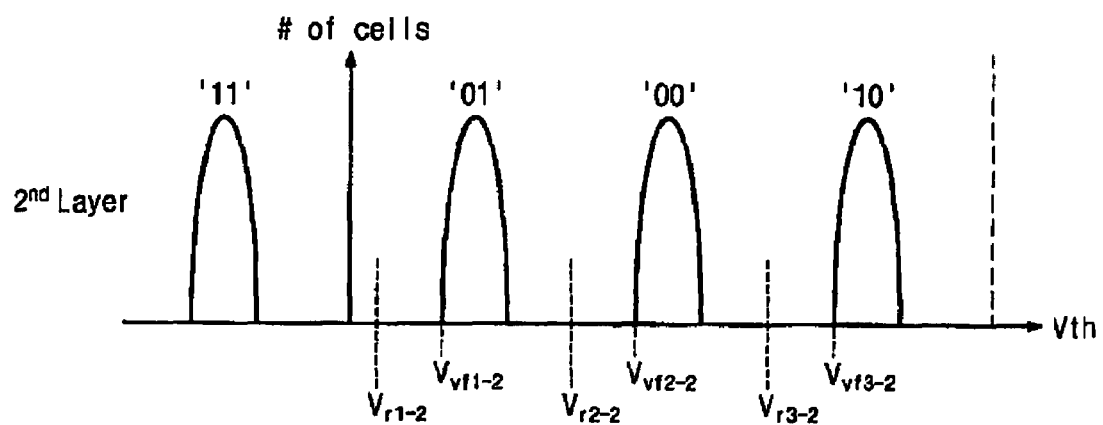

FIGS. 14A and 14B are graphical illustrations of read/verify voltages of the nonvolatile memory device 200 of FIG. 12. Referring to FIGS. 14A and 14B, the threshold voltages of the memory cells in the nonvolatile memory device 200 of the present invention are mainly divided into those of the memory cells in the first layer 212 and those of the memory cells in the second layer 214. As illustrated in FIGS. 14A and 14B, the threshold voltage distribution of the memory cell in the second layer 214 are relatively higher than that of the memory cell in the first layer 212. In the illustrated example, each of the memory cells stores 2-bit data.

In the nonvolatile memory device 200, a read voltage differs according to whether the memory cell belongs to the first layer 212 or the second layer 214. For example, the memory cells in the second layer 214 have read/verify voltages higher than the memory cells in the first layer 212.

Specifically, the read/verify voltages Vr1-2, Vr2-2, Vr3-2, Vvf1-2, Vvf2-2 and Vvf3-2 of the memory cells in the second layer 214 are greater than the read/verify voltages Vr1-1, Vr2-1, Vr3-1, Vvf1-1, Vvf2-1 and Vvf3-1 of the memory cells in the first layer 212. The read voltages Vr1-1, Vr2-1 and Vr3-1 and the verify voltages Vvf1-1, Vvf2-1 and Vvf3-1 for the memory cells in the first layer 212 are controlled by the first layer control logic 242. The read voltages Vr1-2, Vr2-2 and Vr3-2 and the verify voltages Vvf1-2, Vvf2-2 and Vvf3-2 for the memory cells in the second layer 214 are controlled by the second layer control logic 244.

In the nonvolatile memory device 200, the read/verify voltages supplied to the wordline may be varied according to whether the memory cells are positioned in the first layer 212 or the second layer 214 of the multi-layered memory array 210. Also, the erase voltage of the nonvolatile memory device 200 may also vary according to whether the memory cells are positioned in the first layer 212 or the second layer 214.

Further, in the nonvolatile memory device 200, a read operation is performed with respective read voltages according to whether the memory cells belong to the first layer 212 or the second layer 214. Consequently, the nonvolatile memory device 200 can improve a read margin in comparison with the conventional nonvolatile memory device (where the read operation is performed with the same read voltage regardless of whether the memory cells are positioned in the first layer 212 or the second layer 214).

As described above, the nonvolatile memory device may be configured to optimize operating conditions according to structural differences and positions of the memory cells. The invention may be applied to other regions with different threshold voltage distribution characteristics and performance characteristics according to structural positions, for example, between memory blocks, between mats, and between banks. For example, the nonvolatile memory device may be configured to vary operating conditions between a memory block adjacent to a decoder and a memory block far from the decoder. Further, the nonvolatile memory device may be configured to vary operating conditions between a memory block that is used for a specific purpose and a memory block that is generally used.

Figure 15:
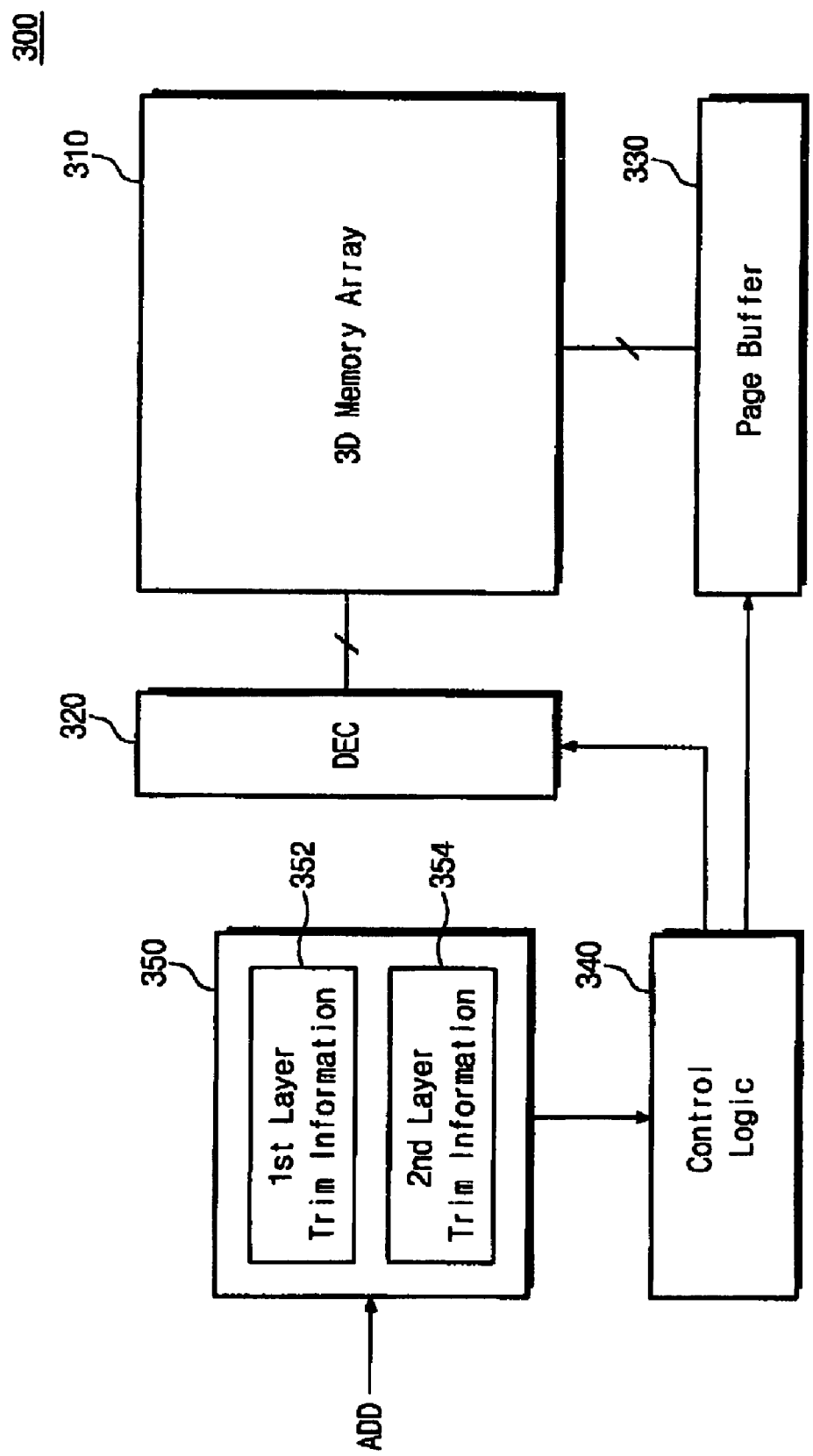
FIG. 15 is a functional block diagram of a nonvolatile memory device according to a third embodiment of the invention.

The control logic 240 of the nonvolatile memory device 200 illustrated in FIG. 12 includes the first layer control logic 242 for controlling the memory cells belonging to the first layer 212, and the second layer control logic 244 for controlling the memory cells belonging to the second layer 214. However, the nonvolatile memory device of the present invention should not be limited to the above-described configuration. As illustrated in FIG. 15, a nonvolatile memory device 300 includes control logic 340 that is configured to control a row decoder 320 and a page buffer 330. A trim information circuit 350 controls an operating condition of the control logic 340. The control logic 340 is configured to operate with a default operating condition, and may operate with different operating conditions according to adjustment information transferred from the trim information circuit 350.

The trim information circuit 350 includes a first layer trim information register 352 having first adjustment information for adjusting the default operating condition of the control logic 340 so as to drive the first layer 212 optimally. The trim information circuit 350 further includes a second layer trim information register 354 having second adjustment information for adjusting the default operating condition of the control logic 340 so as to drive the second layer 214 optimally. The trim information circuit 350 is responsive to an inputted address ADD to determine whether to transfer the first adjustment information of the first layer trim information register 352 or the second adjustment information of the second layer trim information register 354 to the control logic 340. Although FIG. 15 illustrates that the trim information circuit 350 includes two trim information registers 352 and 354, the invention is not limited to two trim information registers. Alternatively, the trim information circuit 350 may include more than two trim information registers that store adjustment information associated with three or more layers.

Figure 16:
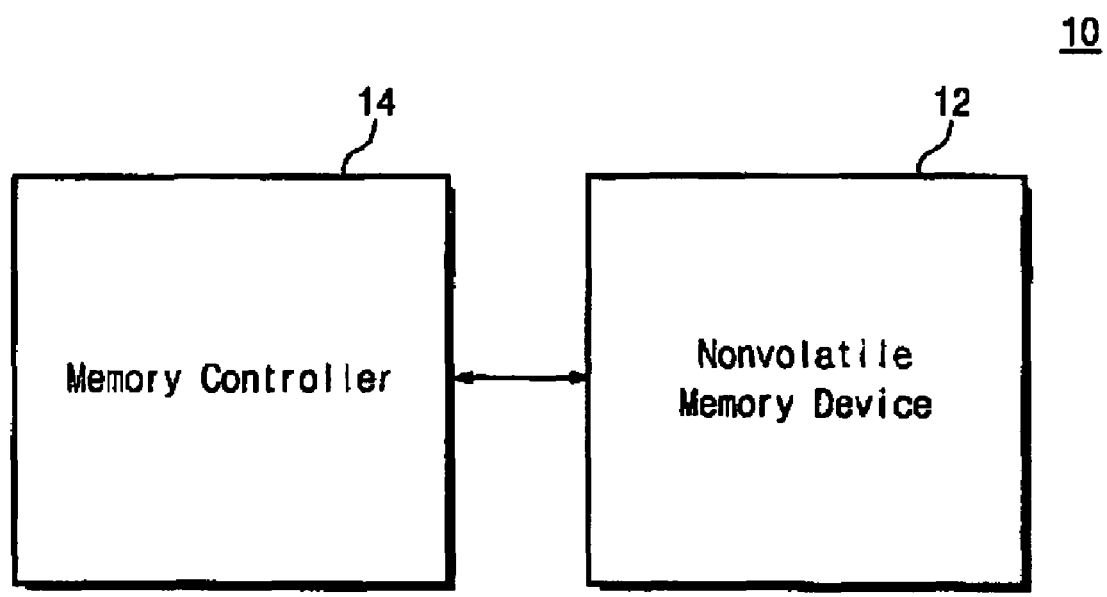
FIG. 16 is a functional block diagram of a memory system according to an embodiment of the invention.

FIG. 16 is a block diagram of a memory system 10 according to an embodiment of the invention. Referring to FIG. 16, the memory system 10 includes a nonvolatile memory device 12 coupled to a memory controller 14 that is configured to control the nonvolatile memory device 12. The nonvolatile memory device 12 may be, for example, the nonvolatile memory device 100 in FIG. 5, the nonvolatile memory device 200 in FIG. 12, or the nonvolatile memory device 300 in FIG. 15.

The nonvolatile memory device 12 can retain stored data even if power supply is removed. With the increase of mobile devices such as cellular phones, Personal Digital Assistants (PDAs), portable game consoles, and Moving Picture Experts Group (MPEG) audio layer 3 (MP3) players, flash memory devices are increasingly used for code and data storage. In addition, nonvolatile memory devices may be used in home applications such as High Definition Televisions (HDTVs), Digital Video Discs (DVDs), routers, and Global Positioning System (GPS) devices.

A nonvolatile memory device according to an embodiment of the invention is applicable to an embedded system. The embedded system, which is a computing system built in another apparatus, performs a computing operation suitable for a specific purpose. The embedded system may include a Central Processing Unit (CPU) and an operating system. An application may be executed by the operating system of the embedded system to perform a specific operation. The embedded system may be built into an apparatus such as a military apparatus, an industrial apparatus, a communication apparatus, a set-top box, or home appliances such as a Digital Television (DTV) or a digital camera.

Figure 17:
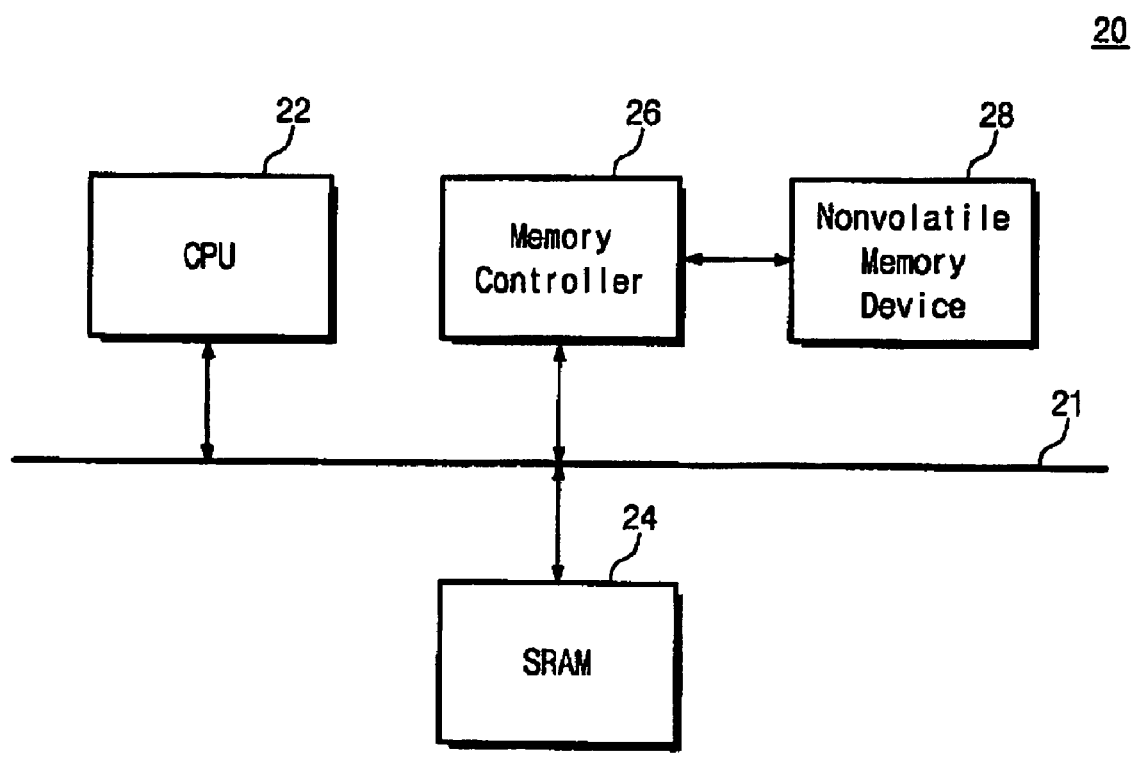
FIG. 17 is a functional block diagram of an embedded memory system having a nonvolatile memory device according to an embodiment of the invention.

FIG. 17 is a functional block diagram and an embedded memory system 20 having a nonvolatile memory device according to an embodiment of the invention. Referring to FIG. 17, the embedded memory system 20 includes a central processing unit (CPU) 22 electrically connected to a bus 21, an SRAM 24, a memory controller 26 and a nonvolatile memory device 28. The nonvolatile memory device 28 may have substantially the same configuration as described above with references to FIGS. 5,12 or 15. The nonvolatile memory device 28 may store N-bit data (N is a positive integer) processed/to be processed by the CPU 22 through the memory controller 26.

Although not shown, the embedded memory system 20 may further include an application chipset, a camera image processor (CIS), a mobile DRAM, or other devices, according to application requirements. The memory controller 26 and the nonvolatile memory device 28 may be configured with, for example, a solid state drive/disk (SSD) that uses the nonvolatile memory device 28 in storing data.

The nonvolatile memory device 28 and/or the memory controller 26 may be packaged in a variety of ways, according to design choice. For example, the nonvolatile memory device 28 and/or the memory controller 26 may be mounted in a package on package (PoP), ball grid array (BGA) package, chip scale package (CSP), plastic leaded chip carrier (PLCC), plastic dual in-line package (PDIP), die in waffle pack, die in wafer form, chip-on-board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi-chip package (MCP), wafer-level fabricated package (WFP) or wafer-level processed stack package (WSP).

According to embodiments of the nonvolatile memory device, it is possible to improve threshold voltage distribution and performance because the nonvolatile memory device operates in different ways according to a structural position of a memory cell.

The above-disclosed subject matter is to be considered illustrative, and not restrictive, and the appended claims are intended to cover all such modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A method of driving a nonvolatile memory device, the method comprising:
    determining a structural shape and position of a memory cell to be driven; and
    driving the memory cell with an optimized operating condition according to a threshold voltage distribution of the memory cell using a determination result,
    wherein the threshold voltage distribution varies according to whether the memory cell to be driven is an even-numbered memory cell or an odd-numbered memory cell.

2. The method of claim 1, wherein the operating condition includes a wordline voltage, a bitline voltage, a well voltage, and timings thereof.

3. The method of claim 1, the operating condition includes program/read/erase conditions.

4. The method of claim 1, wherein a width of an even-numbered wordline to which the even-numbered memory cell is connected is different from a width of an odd-numbered wordline to which the odd-numbered memory cell is connected.

5. The method of claim 4, wherein the operating condition is a program operating condition, the memory cell is programmed with one of a first program operating condition and a second program operating condition according to whether a wordline to which the memory cell to be driven is connected is the even-numbered memory cell or the odd-numbered memory cell, the first program operating condition and the second program operating condition being different from each other.

6. The method of claim 5, wherein driving the memory cell includes executing an incremental step pulse programming (ISPP) method, and each of the first and second program operating conditions including a program start voltage, an ISPP incremental level and a program stop voltage.

7. The method of claim 1, wherein the operating condition differs according to whether a bitline to which the memory cell to be driven is connected is an even-numbered bitline or an odd-numbered bitline, wherein the operating condition is a bitline sensing operating condition, and driving the memory cell includes executing the sensing operating condition with one of a first sensing operating condition and a second sensing operating condition according to whether the bitline is an even-numbered bitline or an odd-numbered bitline, the first and second sensing operating conditions being different from each other.

8. The method of claim 1, wherein the nonvolatile memory device has a memory array with at least a first layer and a second layer, and driving the memory cell includes using one of a first driving operation condition and a second driving operating condition according to whether the memory cell to be driven belongs to the first layer or the second layer, the first and second driving operating conditions being different from each other.

9. A nonvolatile memory device, comprising:
  memory cells having threshold voltage distribution characteristics varying with structural shape and position, wherein the threshold voltage distribution characteristics vary according to whether a memory cell an even-numbered memory cell or an odd-numbered memory cell; and
  a control circuit configured to control an optimized operating condition for respective ones of the memory cells.

10. The nonvolatile memory device of claim 9, wherein the structural shape and position include width of a wordline, width and height of an active region, and distance between two adjacent wordlines.

11. The nonvolatile memory device of claim 9, wherein the two memory cells are included by at least two layers of three-dimensional memory, respectively.

12. A nonvolatile memory device, comprising:
  a memory cell array including a plurality of memory cells, each of the plurality of memory cells being located at an intersection of a plurality of wordlines and a plurality of bitlines;
  a row decoder coupled to the memory cell array and configured to select one of the plurality of wordlines; and
  a wordline voltage generator coupled to the row decoder and configured to output a wordline voltage, the wordline voltage having an operating condition according to a threshold voltage distribution associated with a selected one of the plurality of memory cells,
  wherein the threshold voltage distribution varies according to whether the selected one of the plurality of memory cells is an even-numbered memory cell or an odd-numbered memory cell.

13. The nonvolatile memory device of claim 12, wherein the wordline voltage generator comprises:
  an even voltage trim circuit configured to output the wordline voltage with a first program operating condition when the selected one of the plurality of memory cells is the even-numbered memory cell; and
  an odd voltage trim circuit configured to output the wordline voltage with a second program operating condition when the selected one of the plurality of memory cells is the odd-numbered memory cell.

14. The nonvolatile memory device of claim 13, wherein, during a read/verify operation, the even voltage trim circuit is configured to generate the wordline voltage with a first read/verify condition and the odd voltage trim circuit is configured to generate the wordline voltage with a second read/verify condition, the first and second read/verify conditions being different from each other.

15. The nonvolatile memory device of claim 12, wherein the nonvolatile memory device comprises:
  a page buffer coupled to the memory cell array and configured to read data associated with the selected one of the plurality of memory cells through a bitline associated with the selected one of the plurality of memory cells; and
  a control logic coupled to the page buffer and configured to sense the bitline associated with the selected one of the plurality of memory cells according to whether the selected one of the plurality of memory cells is the even-numbered memory cell or the odd-numbered memory cell.

16. The nonvolatile memory device of claim 15, wherein the control logic comprises:
  an even time trim circuit configured to precharge the bitline associated with the selected one of the plurality of memory cells for a first precharge time and develop the bitline associated with the selected one of the plurality of memory cells for a first cell current development time when the selected one of the plurality of memory cells is the even-numbered cell; and
  an odd time trim circuit configured to precharge the bitline associated with the selected one of the plurality of memory cells for a second precharge time and develop the bitline associated with the selected one of the plurality of memory cells for a second cell current development time when the selected one of the plurality of memory cells is the odd-numbered cell.

17. The nonvolatile memory device of claim 12, wherein the memory cell array has a three-dimensional memory structure, and
  a threshold voltage distribution differs according to whether the selected one of the plurality of memory cells is associated with a first layer of the memory cell array or a second layer of the memory cell array.

18. The nonvolatile memory device of claim 17, wherein the wordline voltage generator comprises:
  a first layer control logic configured to output the wordline voltage using a first program operating condition when the selected one of the plurality of memory cells is associated with the first layer of the memory cell array; and
  a second layer control logic configured to output the wordline voltage using a second program operating condition when the selected one of the plurality of memory cells is associated with the second layer of the memory cell array.

19. The nonvolatile memory device of claim 18, wherein the first layer control logic is configured to output the wordline voltage using a first read/verify condition during a read/verify operation associated with the first layer of the memory cell array and the second layer control logic is configured to output the wordline voltage using a second read/verify condition during a read/verify operation associated with the second layer of the memory cell array, the first and second read/verify conditions being different from each other.

* * * * *